(12) United States Patent
Shirahige

(10) Patent No.: US 12,543,393 B2
(45) Date of Patent: Feb. 3, 2026

(54) PHOTOELECTRIC CONVERSION APPARATUS AND PHOTOELECTRIC CONVERSION SYSTEM HAVING A CONCENTRATION OF IMPURITY OF A CONDUCTIVITY TYPE IN ONE REGION HIGHER THAN ANOTHER REGION

(71) Applicant: CANON KABUSHIKI KAISHA, Tokyo (JP)

(72) Inventor: Daiki Shirahige, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 370 days.

(21) Appl. No.: 18/326,711

(22) Filed: May 31, 2023

(65) Prior Publication Data
US 2023/0395620 A1 Dec. 7, 2023

(30) Foreign Application Priority Data
Jun. 6, 2022 (JP) .................. 2022-091511

(51) Int. Cl.
*H10F 39/00* (2025.01)
*H10F 39/18* (2025.01)

(52) U.S. Cl.
CPC ......... *H10F 39/8033* (2025.01); *H10F 39/18* (2025.01); *H10F 39/8063* (2025.01); *H10F 39/807* (2025.01)

(58) Field of Classification Search
CPC .. H10F 39/8033; H10F 39/18; H10F 39/8063; H10F 39/807; H10F 39/80377; H10F 39/802; H10F 39/80373; H10F 39/014; H10F 39/8037
See application file for complete search history.

(56) References Cited

U.S. PATENT DOCUMENTS

| | | | | |
|---|---|---|---|---|
| 5,994,162 A * | 11/1999 | Burghartz | ............. | H10F 30/245 438/57 |
| 8,022,492 B2 * | 9/2011 | Iwasaki | .................. | H10F 39/807 257/292 |
| 9,035,434 B2 * | 5/2015 | Nakamura | ........... | H10D 12/481 257/493 |
| 10,204,950 B1 * | 2/2019 | Yamashita | ............ | H10F 39/811 |
| 10,446,601 B2 * | 10/2019 | Otake | ................. | H10F 39/8027 |
| 11,082,649 B2 * | 8/2021 | Takizawa | ............. | H04N 25/771 |

(Continued)

FOREIGN PATENT DOCUMENTS

JP 2022055214 A 4/2022

*Primary Examiner* — Caleb E Henry
(74) *Attorney, Agent, or Firm* — Canon U.S.A., Inc. IP Division

(57) ABSTRACT

An apparatus includes a diode in a layer having a first surface, a second surface opposite the first surface, and a third surface between the first and second surfaces. The diode includes a first region of a first conductivity type at first depth, a second region of a second conductivity type at second depth deeper than the first depth with respect to the second surface, a third region at third depth deeper than the second depth, a fourth region that contacts the third region, a first contact electrode that contacts the second surface and supplies first voltage to the first region, and a second contact electrode that contacts the third surface and supplies second voltage different from the first voltage to the fourth region. The third surface is located between the second region and the second surface.

19 Claims, 23 Drawing Sheets

(56) References Cited

U.S. PATENT DOCUMENTS

| | | | |
|---|---|---|---|
| 11,257,945 B2* | 2/2022 | Okumura | H01L 21/02579 |
| 11,309,442 B2* | 4/2022 | Morimoto | H10F 77/306 |
| 11,573,336 B2* | 2/2023 | Deumel | G01T 1/2023 |
| 11,581,359 B2* | 2/2023 | Deumel | H10F 39/026 |
| 12,324,265 B2* | 6/2025 | Tarek | H10F 39/8033 |
| 2005/0098732 A1* | 5/2005 | Liu | H10F 39/018 |
| | | | 250/370.11 |
| 2013/0002918 A1* | 1/2013 | Kobayashi | H10F 39/8037 |
| | | | 348/311 |
| 2013/0126744 A1* | 5/2013 | Jansen | A61B 6/037 |
| | | | 257/E31.127 |
| 2013/0126998 A1* | 5/2013 | Shahar | H10F 30/301 |
| | | | 438/57 |
| 2013/0161772 A1* | 6/2013 | Chan | H10F 77/331 |
| | | | 257/E31.129 |
| 2015/0194459 A1* | 7/2015 | Rusian | H10F 77/1237 |
| | | | 257/428 |
| 2017/0160405 A1* | 6/2017 | Kim | G01T 1/201 |
| 2017/0244921 A1* | 8/2017 | Velichko | H10F 39/8057 |
| 2017/0345856 A1* | 11/2017 | Suzuki | H10F 39/811 |
| 2018/0106910 A1* | 4/2018 | Verbakel | G01T 1/241 |
| 2018/0108800 A1* | 4/2018 | Morimoto | H10F 39/107 |
| 2018/0136344 A1* | 5/2018 | Nelson | G01T 1/20181 |
| 2018/0277608 A1* | 9/2018 | Lifka | G01T 1/24 |
| 2019/0006399 A1* | 1/2019 | Otake | H10F 39/811 |
| 2019/0123110 A1* | 4/2019 | Fischer | H10K 30/353 |
| 2019/0154851 A1* | 5/2019 | Wieczorek | G01T 1/242 |
| 2019/0280145 A1* | 9/2019 | Natsuaki | H10F 30/225 |
| 2020/0119067 A1* | 4/2020 | Choi | H10F 39/8023 |
| 2020/0286934 A1* | 9/2020 | Hirase | H04N 25/57 |
| 2020/0328203 A1* | 10/2020 | Yamaji | H10D 89/611 |
| 2020/0365719 A1* | 11/2020 | Nishimura | H10D 30/668 |
| 2020/0403066 A1* | 12/2020 | Narita | H10D 62/107 |
| 2021/0239859 A1* | 8/2021 | Deumel | H10K 30/81 |
| 2021/0242273 A1* | 8/2021 | Deumel | H10F 39/807 |
| 2022/0013551 A1* | 1/2022 | Mun | H10F 39/18 |
| 2022/0052092 A1* | 2/2022 | Furumi | H10F 39/18 |
| 2022/0246782 A1* | 8/2022 | Inoue | H10F 39/12 |
| 2022/0271067 A1* | 8/2022 | Sugiura | H10F 30/225 |
| 2022/0302183 A1* | 9/2022 | Abdelghafar | H04N 25/773 |
| 2022/0303494 A1* | 9/2022 | Negoro | H10K 39/32 |
| 2022/0321794 A1* | 10/2022 | Yoneda | H04N 25/77 |
| 2022/0406823 A1* | 12/2022 | Wang | H10F 39/8027 |
| 2023/0063377 A1* | 3/2023 | Inoue | H10F 39/199 |
| 2023/0215893 A1* | 7/2023 | Sekine | H10F 39/199 |
| | | | 257/292 |

* cited by examiner

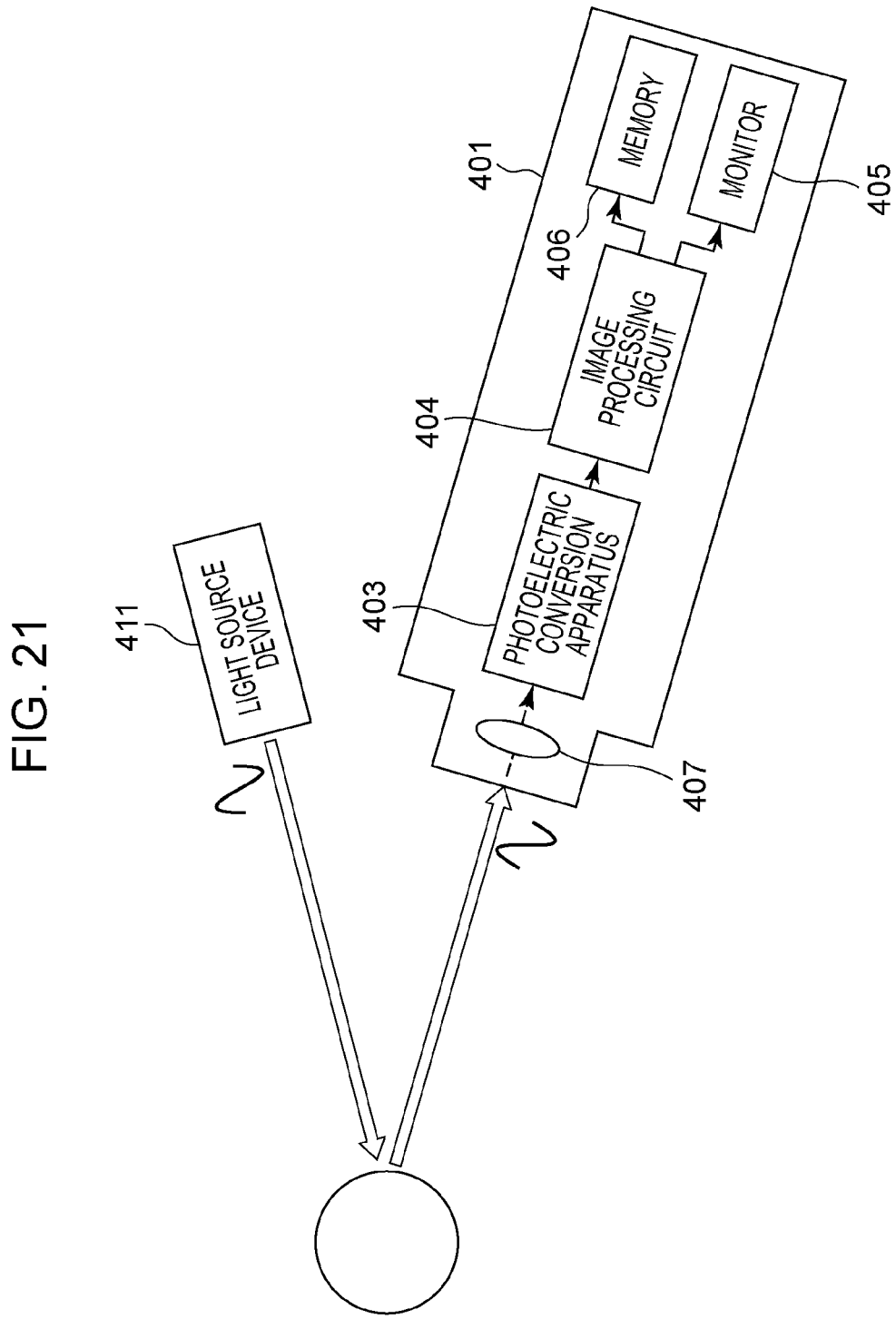

PHOTOELECTRIC CONVERSION APPARATUS AND PHOTOELECTRIC CONVERSION SYSTEM HAVING A CONCENTRATION OF IMPURITY OF A CONDUCTIVITY TYPE IN ONE REGION HIGHER THAN ANOTHER REGION

BACKGROUND

Technical Field

The aspect of the embodiments relates to a photoelectric conversion apparatus and a photoelectric conversion system using the photoelectric conversion apparatus.

Description of the Related Art

Japanese Patent Laid-Open No. 2022-055214 describes a single-photon avalanche diode (SPAD) that prevents an increase in pixel size while avoiding the occurrence of a tunnel effect by providing a vertical distance between a cathode electrode and an anode electrode.

In the structure described in Japanese Patent Laid-Open No. 2022-055214, the dark count rate (DCR) deteriorates because the cathode electrode and a region where the avalanche multiplication occurs are close to each other.

SUMMARY

According to an aspect of the embodiments, an apparatus includes a diode disposed in a layer having a first surface, a second surface opposite the first surface, and a third surface located between the first surface and the second surface. The diode includes a first region of a first conductivity type disposed at a first depth, a second region of a second conductivity type disposed at a second depth that is deeper than the first depth with respect to the second surface, a third region disposed at a third depth that is deeper than the second depth with respect to the second surface, a fourth region in contact with the third region, a first electrode in contact with the second surface of the layer, wherein the first electrode supplies a first voltage to the first region, and a second electrode in contact with the third surface of the layer, wherein the second electrode supplies a second voltage different from the first voltage to the fourth region. The third surface is located between the second region and the second surface.

According to another aspect of the embodiments, an apparatus includes a plurality of diodes disposed in a layer having a first surface, a second surface opposite the first surface, and a third surface located between the first surface and the second surface. The diode includes a first region of a first conductivity type disposed at a first depth, a second region of a second conductivity type disposed at a second depth that is deeper than the first depth with respect to the second surface, a third region disposed at a third depth that is deeper than the second depth with respect to the second surface, a fourth region in contact with the third region, a first electrode in contact with the second surface of the layer, wherein the first electrode supplies a first voltage to the first region, a second electrode in contact with the third surface of the layer, wherein the second electrode supplies a second voltage different from the first voltage to the fourth region, and a fifth region having a concentration of impurity of the first conductivity type that is lower than a concentration of impurity of the first conductivity type in the first region. The fifth region is in contact with part of a side wall of a trench structure having the third surface.

Further features of the disclosure will become apparent from the following description of exemplary embodiments with reference to the attached drawings.

BRIEF DESCRIPTION OF THE DRAWINGS

FIG. 21 is a functional block diagram of a photoelectric conversion system according to an eighth embodiment.

DESCRIPTION OF THE EMBODIMENTS

Figure 1:
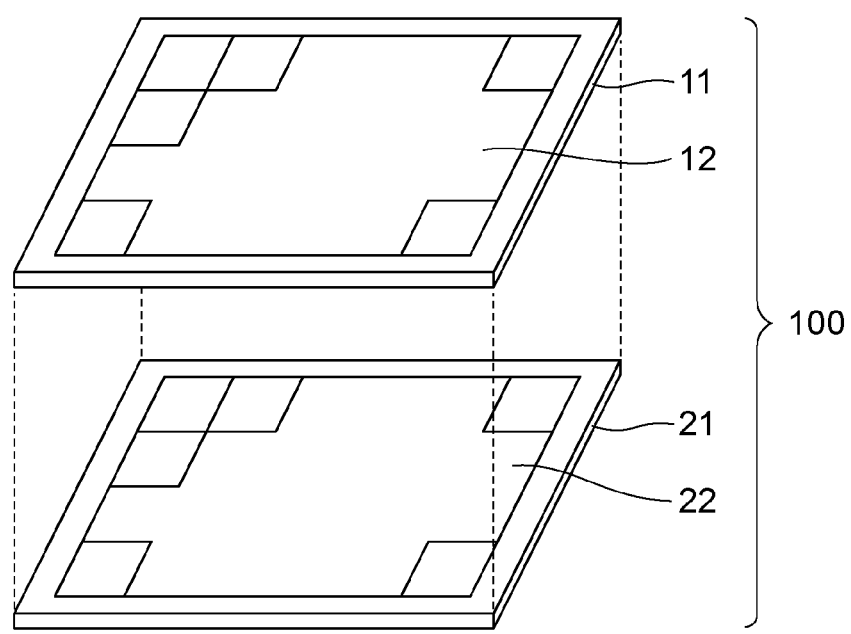
FIG. 1 is a schematic illustration of a photoelectric conversion apparatus according to an embodiment.

Embodiments described below are for embodying the technical concept of the disclosure and are not intended to limit the disclosure. The sizes and positional relationships of members illustrated in the drawings may be exaggerated for clarity of description. In the following description, the same configuration may be identified by the same reference numeral, and description may be omitted.

The embodiments of the disclosure are described in detail below with reference to the accompanying drawings. In the following description, the terms indicating specific directions and positions (for example, "upper", "lower", "right", "left", and other terms including these terms) are used as necessary. These terms are used to facilitate understanding of the embodiments with reference to the drawings, and the technical scope of the disclosure is not limited by the meanings of the terms.

As used herein, the term "plan view" is used to refer to a view in a direction perpendicular to the light incident surface of a semiconductor layer. The term "cross-sectional view" refers to a plane in a direction perpendicular to the light incident surface of the semiconductor layer. When the light incident surface of the semiconductor layer is microscopically rough, the plan view is defined on the basis of the light incident surface of the semiconductor layer when viewed macroscopically.

In the following description, the anode of an avalanche photodiode (APD) is set at a fixed electric potential, and a signal is taken from the cathode side. Therefore, a semiconductor region of a first conductivity type in which the charges of a polarity the same as that of a signal charge are majority carriers is an N-type semiconductor region, and a semiconductor region of a second conductivity type in which the charges of the polarity different from that of a signal charge are majority carriers is a P-type semiconductor region.

The disclosure can also be applied when the cathode of the APD is set at a fixed electric potential and the signal is taken from the anode side. In this case, the semiconductor region of the first conductivity type in which charges of a polarity the same as that of the signal charge are majority carriers is a P-type semiconductor region, and the semiconductor region of the second conductivity type in which charges of a polarity different from that of the signal charge are majority carriers is an N-type semiconductor region. Hereinafter, the case where one of the nodes of the APD is set to a fixed electric potential is described below. However, the potentials of both nodes may vary.

The term "impurity concentration" as simply used herein refers to the net impurity concentration obtained after subtracting the amount compensated by the impurity of an opposite conductivity type. That is, the term "impurity concentration" refers to the NET doping concentration. A region in which the P-type additive impurity concentration is higher than the N-type additive impurity concentration is a P-type semiconductor region. In contrast, a region in which the N-type additive impurity concentration is higher than the P-type additive impurity concentration is an N-type semiconductor region.

A configuration common to all embodiments of a photoelectric conversion apparatus and a method for driving the photoelectric conversion apparatus according to the disclosure are described below with reference to FIGS. 1 to 4 and FIGS. 5A to 5C.

FIG. 1 illustrates the configuration of a lamination type photoelectric conversion apparatus 100 according to an embodiment of the disclosure.

The photoelectric conversion apparatus 100 is configured by stacking and electrically connecting a sensor substrate 11 with a circuit substrate 21. The sensor substrate 11 has a first semiconductor layer including photoelectric conversion elements 102 (described below) and a first wiring structure. The circuit substrate 21 has a second semiconductor layer including circuits, such as a signal processing unit 103 (described below), and a second wiring structure. The photoelectric conversion apparatus 100 is configured by stacking the second semiconductor layer, the second wiring structure, the first wiring structure, and the first semiconductor layer in this order. The photoelectric conversion apparatus described in each of the embodiments is a back-illuminated photoelectric conversion apparatus in which light is incident on a first surface and a circuit substrate is disposed on a second surface.

Although the sensor substrate 11 and the circuit substrate 21 in the form of diced chips are described below, the forms are not limited to chips. For example, the substrates may be wafers. In addition, the substrates in the form of wafers may be stacked and then diced or may be made into chips and then stacked and bonded.

The sensor substrate 11 has a pixel region 12 disposed therein, and the circuit substrate 21 has, disposed therein, a circuit region 22 for processing signals detected by the pixel region 12.

Figure 2:
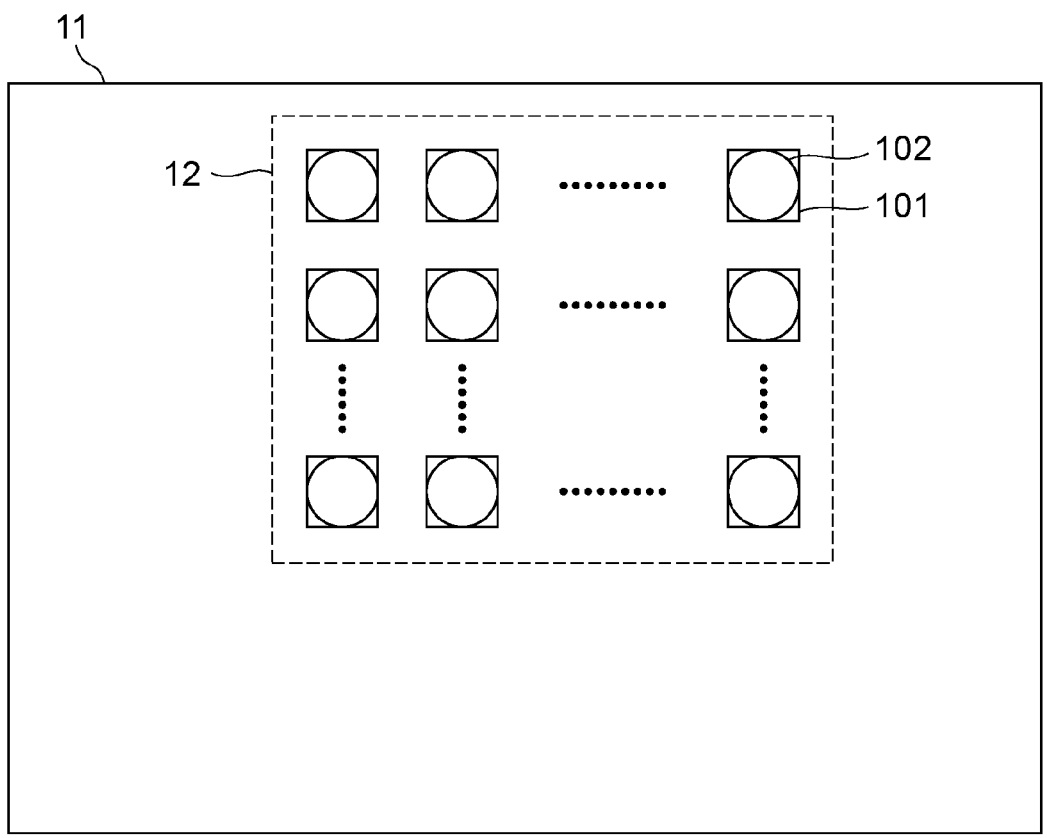
FIG. 2 is a schematic illustration of a sensor substrate of the photoelectric conversion apparatus according to the embodiment.

FIG. 2 illustrates an arrangement example in the sensor substrate 11. Pixels 101 each having a photoelectric conversion element 102 including an avalanche photodiode (APD) are arranged in a two-dimensional array in plan view to form the pixel region 12.

The pixels 101 are typically pixels for forming an image. However, when used for TOF (Time of Flight), the pixels 101 do not necessarily form an image. That is, the pixels 101 may be pixels for measuring the time and the amount of light when the light reaches the pixels 101.

Figure 3:
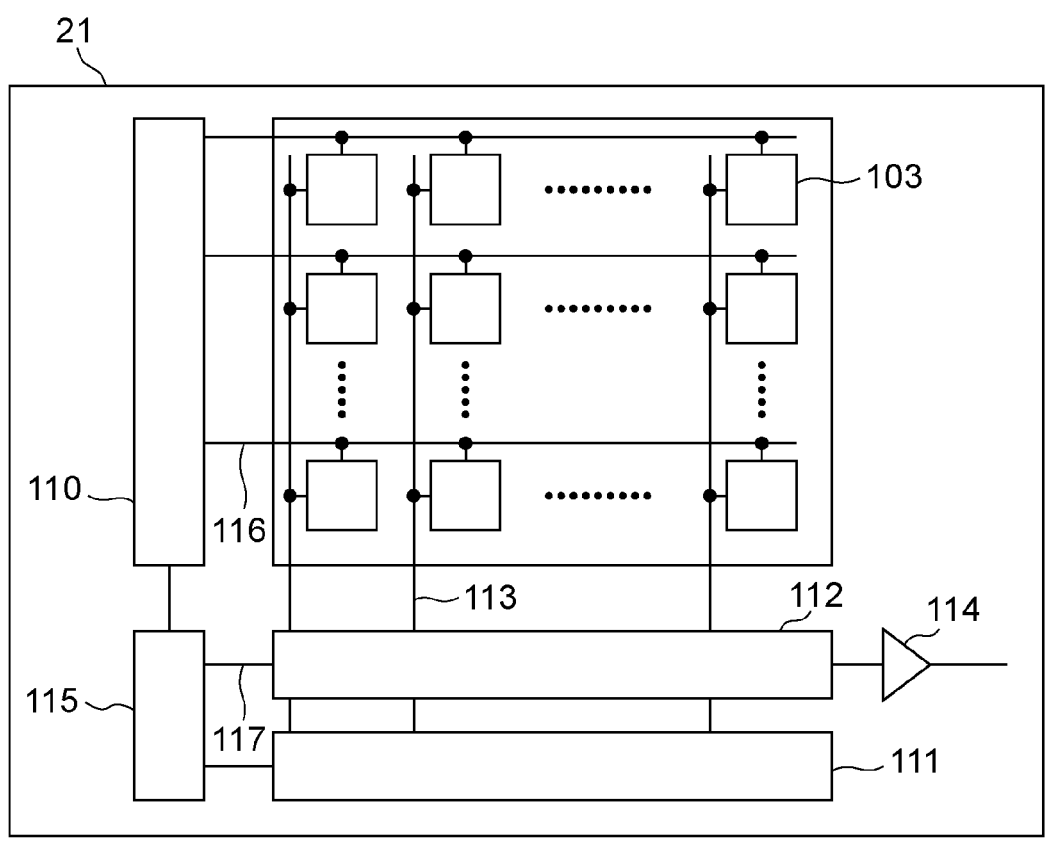
FIG. 3 is a schematic illustration of a circuit substrate of the photoelectric conversion apparatus according to the embodiment.

FIG. 3 is a configuration diagram of the circuit substrate 21. The circuit substrate 21 includes the signal processing units 103 that process charges photoelectrically converted by the photoelectric conversion elements 102 illustrated in FIG. 2, a column circuit 112, a control pulse generation circuit 115, a horizontal scanning circuit unit 111, a signal lines 113, and a vertical scanning circuit unit 110.

The photoelectric conversion element 102 illustrated in FIG. 2 and the signal processing unit 103 illustrated in FIG. 3 are electrically connected via a connection conductive line provided for each of the pixels.

The vertical scanning circuit unit 110 receives a control pulse supplied from the control pulse generation unit 115 and supplies the control pulse to each of the pixels. Logic circuits, such as a shift register and an address decoder, are used in the vertical scanning circuit unit 110.

A signal output from the photoelectric conversion element 102 of the pixel is processed by the signal processing unit 103. The signal processing unit 103 includes a counter, a memory, and the like, and a digital value is held in the memory.

The horizontal scanning circuit unit 111 inputs a control pulse for sequentially selecting each of columns to the signal processing unit 103 to read a signal from the memory of each of the pixels that holds the digital signal.

The signal is output to the signal line 113 from the signal processing unit 103 of the pixel selected by the vertical scanning circuit unit 110 for the selected column.

The signal output to the signal line 113 is output to an external recording unit or the signal processing unit of the photoelectric conversion apparatus 100 via an output circuit 114.

In FIG. 2, the array of photoelectric conversion elements in the pixel region may be a one-dimensional array. In addition, in one embodiment, the effect of the disclosure can be obtained even if there is one pixel, and the disclosure also includes the case where there is only one pixel. The function of the signal processing unit does not necessarily have to be provided for each of the photoelectric conversion elements. For example, one signal processing unit may be shared by a plurality of photoelectric conversion elements, and signal processing may be performed sequentially.

As illustrated in FIGS. 2 and 3, a plurality of signal processing units 103 are arranged in a region that overlaps the pixel region 12 in plan view. The vertical scanning circuit unit 110, the horizontal scanning circuit unit 111, the column circuit 112, the output circuit 114, and the control pulse generation unit 115 are arranged so as to overlap a region between the edges of the sensor substrate 11 and the edge of the pixel region 12 in plan view. That is, the sensor substrate 11 has the pixel region 12 and a non-pixel region disposed surrounding the pixel region 12, and the vertical scanning circuit unit 110, the horizontal scanning circuit unit 111, the column circuit 112, the output circuit 114, and the control pulse generation unit 115 are arranged in the region that overlaps the non-pixel region in plan view.

Figure 4:
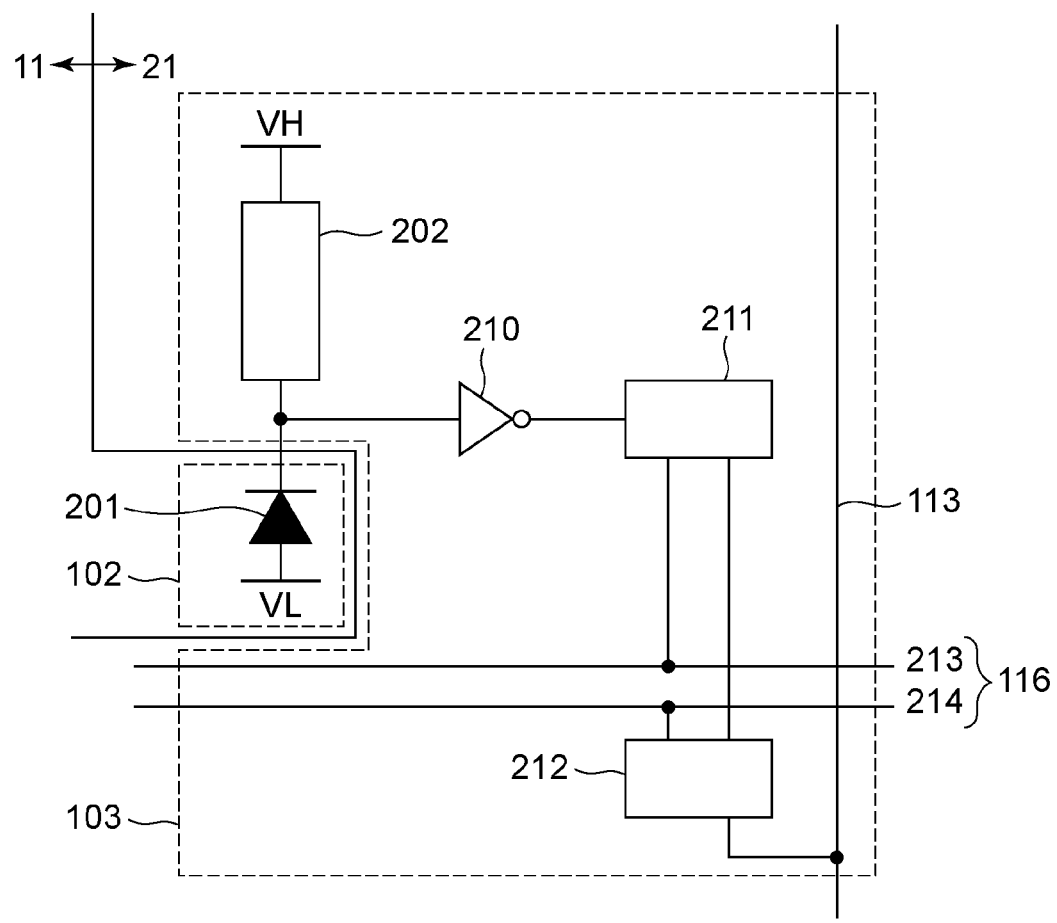
FIG. 4 illustrates a configuration example of a pixel circuit of the photoelectric conversion apparatus according to the embodiment.

FIG. 4 is an example of a block diagram including the equivalent circuit of the configuration illustrated in FIGS. 2 and 3.

In FIG. 2, the photoelectric conversion element 102 including an APD 201 is provided in the sensor substrate 11, and the other members are provided in the circuit substrate 21.

The APD 201 generates charge pairs in accordance with incident light by photoelectric conversion. A voltage VL (a first voltage) is supplied to the anode of the APD 201. In addition, a voltage VH (a second voltage) that is higher than the voltage VL supplied to the anode is supplied to the cathode of the APD 201. A reverse bias voltage is supplied to the anode and cathode so that the APD 201 performs an avalanche multiplication operation. By supplying such voltages, charges generated by the incident light undergo avalanche multiplication, which generates an avalanche current.

When a reverse bias voltage is supplied, an APD has two modes of operation: the Geiger mode in which the potential difference between the anode and cathode is greater than the breakdown voltage and the linear mode in which the potential difference between the anode and cathode is close to or below the breakdown voltage.

An APD operated in the Geiger mode is referred to as an SPAD. For example, the voltage VL (the first voltage) is −30 V, and the voltage VH (the second voltage) is 1 V. The APD 201 may be operated in either the linear mode or the Geiger mode. In the case of SPAD, the potential difference is greater than that of an APD in the linear mode, and the effect of withstand voltage is remarkable. For this reason, it is desirable to use SPAD.

A quenching element 202 is connected to a power source that supplies the voltage VH and the APD 201. The quenching element 202 functions as a load circuit (a quenching circuit) during signal multiplication by avalanche multiplication, reduces the voltage supplied to the APD 201, and has a function of reducing avalanche multiplication (a quenching operation). In addition, the quenching element 202 has a function of causing a current corresponding to the voltage drop due to the quenching operation to flow and returning the voltage supplied to the APD 201 to the voltage VH (a recharge operation).

The signal processing unit 103 includes a waveform shaping unit 210, a counter circuit 211, and a selection circuit 212. Herein, the signal processing unit 103 can include one of the waveform shaping unit 210, the counter circuit 211, and the selection circuit 212.

The waveform shaping unit 210 shapes a change in the potential of the cathode of the APD 201 obtained during photon detection and outputs a pulse signal. For example, an inverter circuit is used as the waveform shaping unit 210. Although FIG. 4 illustrates an example in which one inverter is used as the waveform shaping unit 210, a circuit in which a plurality of inverters are connected in series may be used, or another circuit having a waveform shaping effect may be used.

The counter circuit 211 counts the pulse signals output from the waveform shaping unit 210 and holds a count value. Furthermore, when a control pulse pRES is supplied via a drive line 213, a signal held in the counter circuit 211 is reset.

The selection circuit 212 is supplied with a control pulse pSEL from the vertical scanning circuit unit 110 illustrated in FIG. 3 via a drive line 214 illustrated in FIG. 4 (not illustrated in FIG. 3) and switches between connection and disconnection of the counter circuit 211 from the signal line 113. The selection circuit 212 includes, for example, a buffer circuit for outputting a signal.

A switch, such as a transistor, may be provided between the quenching element 202 and the APD 201 or between the photoelectric conversion element 102 and the signal processing unit 103 to switch the electrical connection. Similarly, the voltage VH and the voltage VL supplied to the photoelectric conversion element 102 may be electrically switched using a switch, such as a transistor.

According to the present embodiment, the configuration using the counter circuit 211 is described. However, the photoelectric conversion apparatus 100 that acquires the pulse detection timing may be achieved by using a time-to-digital converter (hereinafter referred to as a TDC) and a memory instead of the counter circuit 211. At this time, the generation timing of the pulse signal output from the waveform shaping unit 210 is converted into a digital signal by the TDC. To measure the timing of the pulse signal, the TDC receives a control pulse pREF (a reference signal) supplied thereto from the vertical scanning circuit unit 110 illustrated in FIG. 1 via the drive line. The TDC acquires a signal in the form of a digital signal when the input timing of the signal output from each of the pixels via the waveform shaping unit 210 is regarded as a time relative to the control pulse pREF.

Figure 5A:
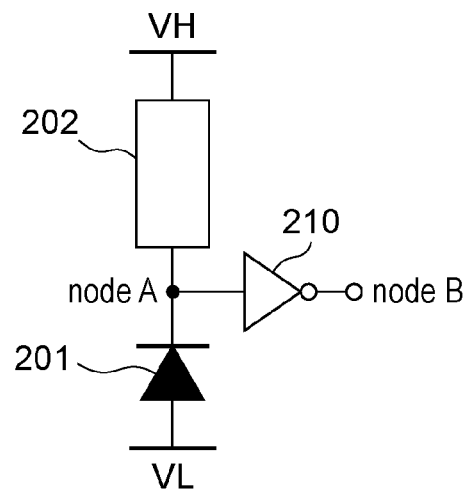
FIGS. 5A to 5C are schematic illustrations of driving of the pixel circuit of the photoelectric conversion apparatus according to the embodiment.
Figure 5B:
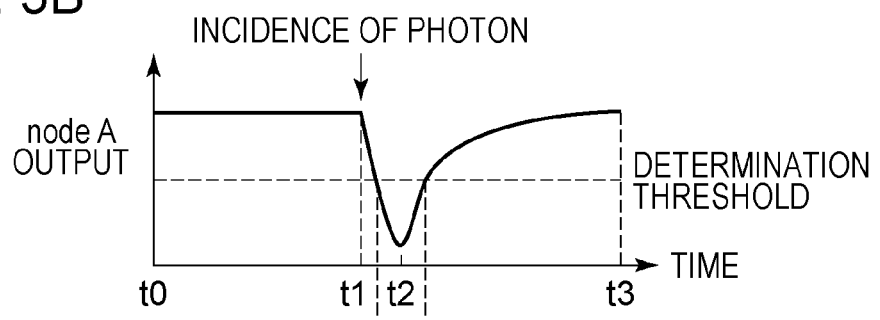
Figure 5C:
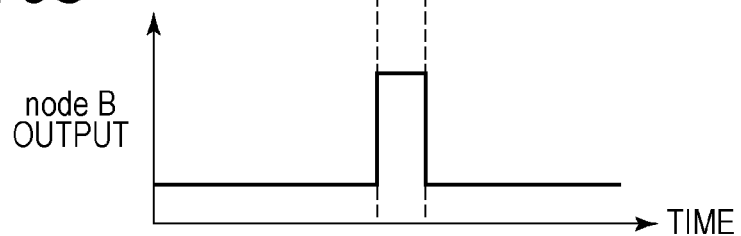

FIGS. 5A to 5C are schematic illustrations of the relationship between the operation performed by the APD and the output signals.

FIG. 5A illustrates the APD 201, the quenching element 202, and the waveform shaping unit 210 illustrated in FIG. 4. In FIG. 5A, let node A be the input side of the waveform shaping unit 210, and let node B be the output side of the waveform shaping unit 210. Then, FIG. 5B illustrates a change in the waveform in the node A illustrated in FIG. 5A, and FIG. 5C illustrates a change in the waveform in the node B illustrated in FIG. 5A.

Between time t0 and time t1, a potential difference of (VH−VL) is applied to the APD 201 illustrated in FIG. 5A. When a photon is incident on the APD 201 at time t1, avalanche multiplication occurs in the APD 201, an avalanche multiplication current flows through the quenching element 202, and the voltage in the node A drops. When the voltage drop amount further increases and the potential difference applied to the APD 201 decreases, the avalanche multiplication in the APD 201 stops at time t2, and the voltage level of the node A does not drop beyond a certain value. Thereafter, between time t2 to time t3, a current that compensates for the voltage drop from the voltage VL flows through the node A. After time t3, the node A remains at the original potential level. At this time, a portion of the output waveform in the node A exceeding a certain threshold is waveform-shaped by the waveform shaping unit 210 and is output as a signal in the node B.

It should be noted that the arrangement of the signal lines 113 and the arrangement of the column circuit 112 and the output circuit 114 are not limited to those illustrated in FIG. 3. For example, the signal lines 113 may be arranged extending in the row direction, and the column circuit 112 may be disposed at the end of the signal line 113 in the extending direction.

A photoelectric conversion apparatus according to each of the embodiments is described below.

First Embodiment

A photoelectric conversion apparatus according to the first embodiment is described below with reference to FIGS. 6 to 9.

Figure 6:
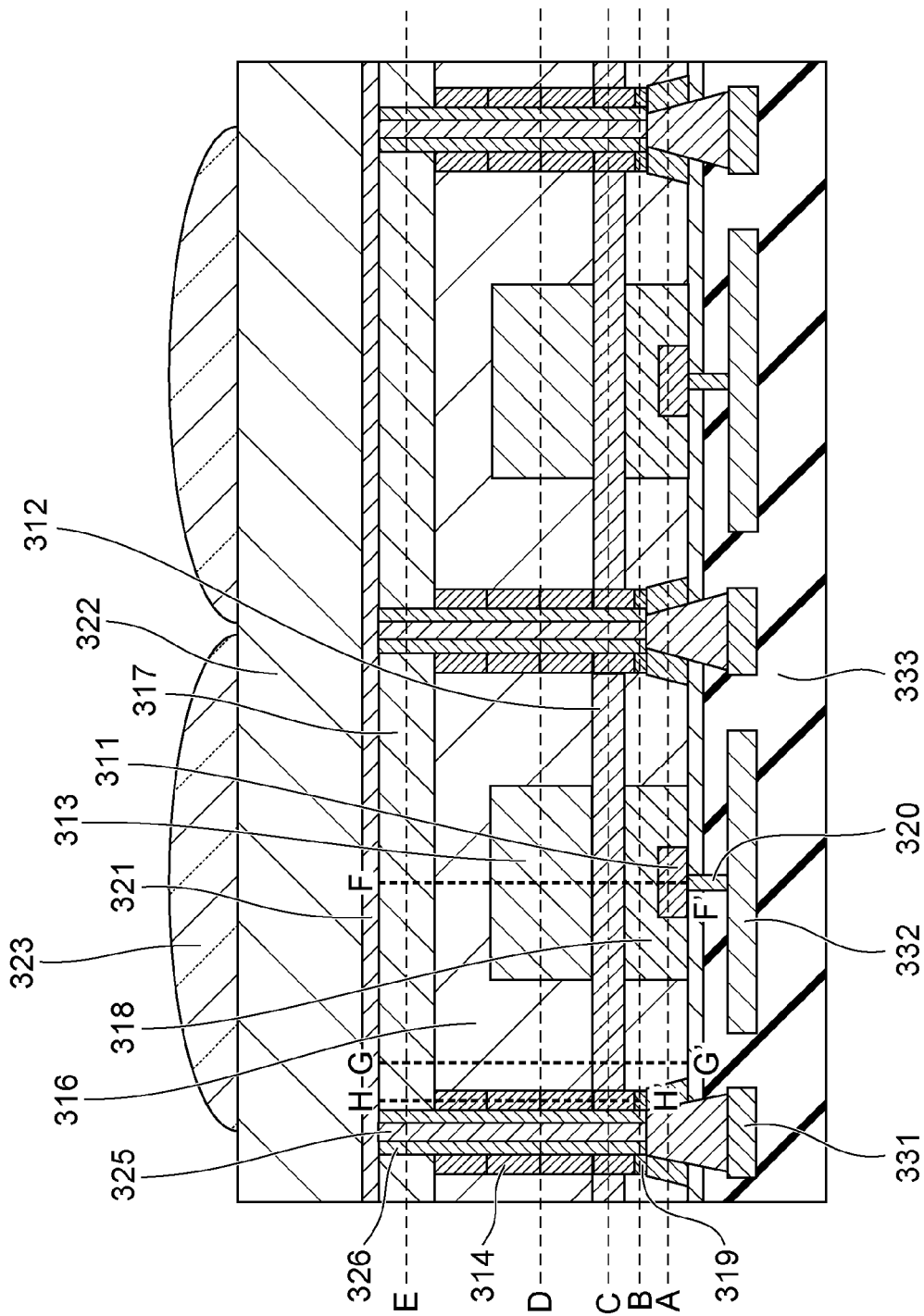
FIG. 6 is a cross-sectional view of a photoelectric conversion element according to a first embodiment.

FIG. 6 is a cross-sectional view of two pixels of the photoelectric conversion elements 102 of the photoelectric conversion apparatus according to the first embodiment, taken in a direction perpendicular to the surface direction of the substrate. FIG. 6 corresponds to a cross-sectional view taken along line A-A' of FIG. 7.

The structure and function of the photoelectric conversion element 102 are described below. The photoelectric conversion element 102 includes an N-type first semiconductor region 311, an N-type third semiconductor region 313, an N-type sixth semiconductor region 316, and an N-type eighth semiconductor region 318. The photoelectric conversion elements 102 further includes a P-type second semiconductor region 312, a P-type fourth semiconductor region 314 and a P-type seventh semiconductor region 317.

According to the present embodiment, as illustrated in the cross section of FIG. 6, the N-type first semiconductor region 311 is formed in the vicinity of the second surface opposite the first surface, which is the light incident surface, (at a height A), and the N-type eighth semiconductor region 318 is formed around the first semiconductor region 311 (at a height B). The P-type second semiconductor region 312 is formed at a position (at a height C) so as to overlap the first semiconductor region 311 and the eighth semiconductor region 318 in plan view. In addition, the third N-type semiconductor region 313 is disposed at a position (at a height D) so as to overlap the second semiconductor region 312 in plan view, and an N-type sixth semiconductor region 316 is formed around the third semiconductor region 313. Furthermore, the P-type seventh semiconductor region 317 is formed adjacent to the first surface (at a height E) so as to overlap the sixth semiconductor region 316 in plan view.

The first semiconductor region 311 has a higher N-type impurity concentration than each of the sixth semiconductor region 316 and the third semiconductor region 313. A PN junction is formed between the P-type second semiconductor region 312 and the N-type first semiconductor region 311. By making the impurity concentration of the second semiconductor region 312 lower than that of the first semiconductor region 311, the entire part of the second semiconductor region 312 that overlaps the center of the first semiconductor region in plan view is turned into a depletion layer region. At this time, the potential difference between the first semiconductor region 311 and the second semiconductor region 312 is greater than the potential difference between the second semiconductor region 312 and the third semiconductor region 313. In addition, the depletion layer region extends to a part of the first semiconductor region 311, and a strong electric field is induced in the extended depletion layer region. The strong electric field causes avalanche multiplication in the depletion layer region extending to the part of the first semiconductor region 311, and an electric current based on the amplified charge is output as signal charge. When light incident on the photoelectric conversion element 102 is photoelectrically converted and avalanche multiplication occurs in the depletion layer region (an avalanche multiplication region), the generated charge of the first conductivity type is collected in the first semiconductor region 311.

Although in FIG. 6, the eighth semiconductor region 318 and the third semiconductor region 313 are formed to have approximately the same size, the size of each of the semiconductor regions is not limited thereto. For example, the third semiconductor region 313 may be formed larger than the eighth semiconductor region 318 to collect charge from a wider area into the first semiconductor region 311.

In addition, the eighth semiconductor region 318 may be a P-type semiconductor region instead of an N-type semiconductor region.

In this case, the P-type impurity concentration of the eighth semiconductor region 318 is set lower than the P-type impurity concentration of the second semiconductor region 312. This is because if the impurity concentration of the eighth semiconductor region 318 is too high, an avalanche multiplication region is formed between the eighth semiconductor region 318 and the first semiconductor region 311, increasing the dark count rate (DCR).

The pixels are separated by a pixel separation portion 325 having a trench structure, and the P-type fourth semiconductor region 314 formed around the pixel separates adjacent photoelectric conversion elements by a potential barrier. Since the photoelectric conversion elements are also separated by the potential of the fourth semiconductor region 314, a trench structure such as the pixel separation portion 325 is not essential as a pixel separation portion. When the pixel separation portion 325 having the trench structure is provided, the depth and position of the trench structure are not limited to those in the configuration illustrated in FIG. 6. The pixel separation portion 325 may be DTI (deep trench isolation) that penetrates the semiconductor layer or may be DTI that does not penetrate the semiconductor layer. A metal may be embedded in the DTI to improve the light shielding performance. The pixel separation portion 325 may be made of SiO, a fixed charge film, a metal member, Poly-Si, or any combination thereof. A configuration may be employed in which the pixel separation portions 325 surround the entire periphery of the photoelectric conversion element in plan view. Alternatively, a configuration may be employed in which, for example, the pixel separation portions 325 are disposed on the opposite sides of the photoelectric conversion element. The DCR may be reduced by applying a voltage to the embedded member to induce charge at the trench interface.

A pinning film 321, a planarizing film 322, and a microlens 323 are further formed adjacent to the light incident surface of the semiconductor layer. Furthermore, a filter layer (not illustrated) or the like may be disposed adjacent to the light incident surface. As the filter layer, an optical filter, such as a color filter, an infrared cut filter, or a monochrome filter, can be used. As the color filter, an RGB color filter, an RGBW color filter, or the like can be used.

A wiring structure including a conductor and an insulating film is provided on the surface opposite the light incident surface of the semiconductor layer. An interlayer film 333, which is the insulating film, is provided between a conductive line and the semiconductor layer and between wiring layers.

A cathode line 332 supplies a first voltage (a cathode voltage) to the first semiconductor region 311 via a first contact electrode 320. An anode line 331 supplies a second voltage (an anode voltage) to the fourth semiconductor region 314 via a P-type ninth semiconductor region 319 which is the second contact electrode 319. The photoelectric conversion element 102 includes a trench structure formed from the second surface toward the first surface of the semiconductor layer. A bottom portion of the trench structure constitutes a third surface of the semiconductor layer, and the ninth semiconductor region 319 is provided in contact with the third surface. STI (Shallow Trench Isolation) is an example of the trench structure in which the third surface is provided. The conductive line is made of a conductor containing a metal, such as Cu or Al.

Figure 7:
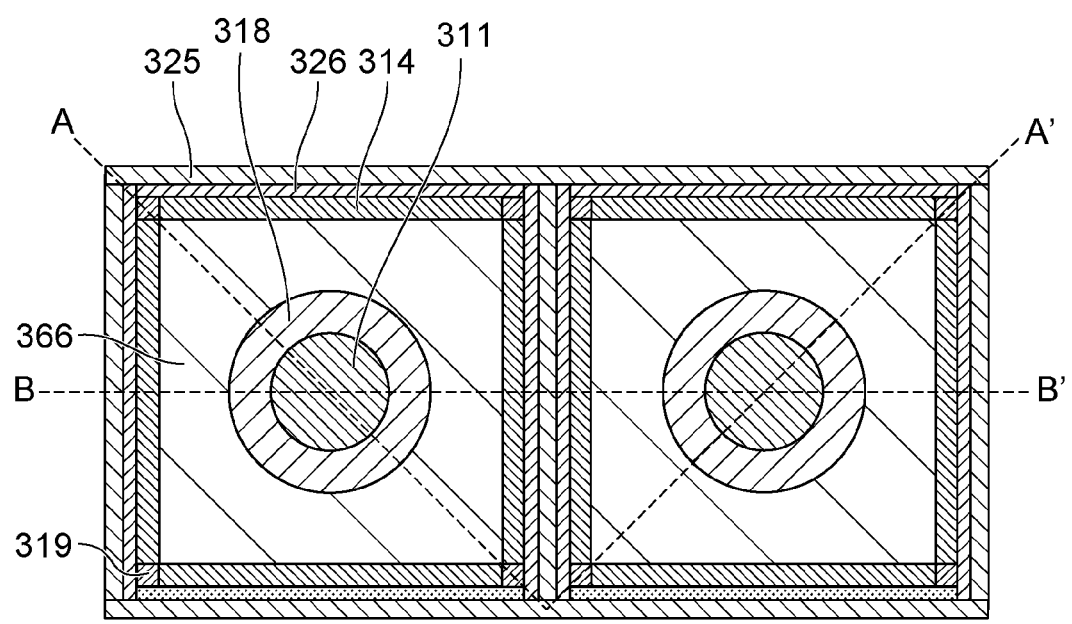
FIG. 7 is a plan view of the photoelectric conversion element according to the first embodiment.

FIG. 7 is a plan view of two pixels of the photoelectric conversion apparatus according to the first embodiment. FIG. 7 is a plan view as viewed from the surface opposite the light incident surface.

In FIG. 7, the first semiconductor region 311 and the eighth semiconductor region 318 are circular in shape and are arranged concentrically. Such a structure reduces local electric field concentration at the edge of a strong electric field region between the first semiconductor region 311 and the second semiconductor region 312 and, thus, reduces the DCR. The shape of each of the semiconductor regions is not limited to a circle and may be, for example, a polygon with the center of gravity aligned.

The fourth semiconductor region 314 is formed in the A-A' cross section (the cross section in the diagonal direction of the pixel) in FIG. 7. Because the second contact electrode 319 is formed in the B-B' in cross section (the cross section in the opposite side direction of a pixel), the fourth semiconductor region 314 need not be formed to extend to the second surface.

Figure 8:
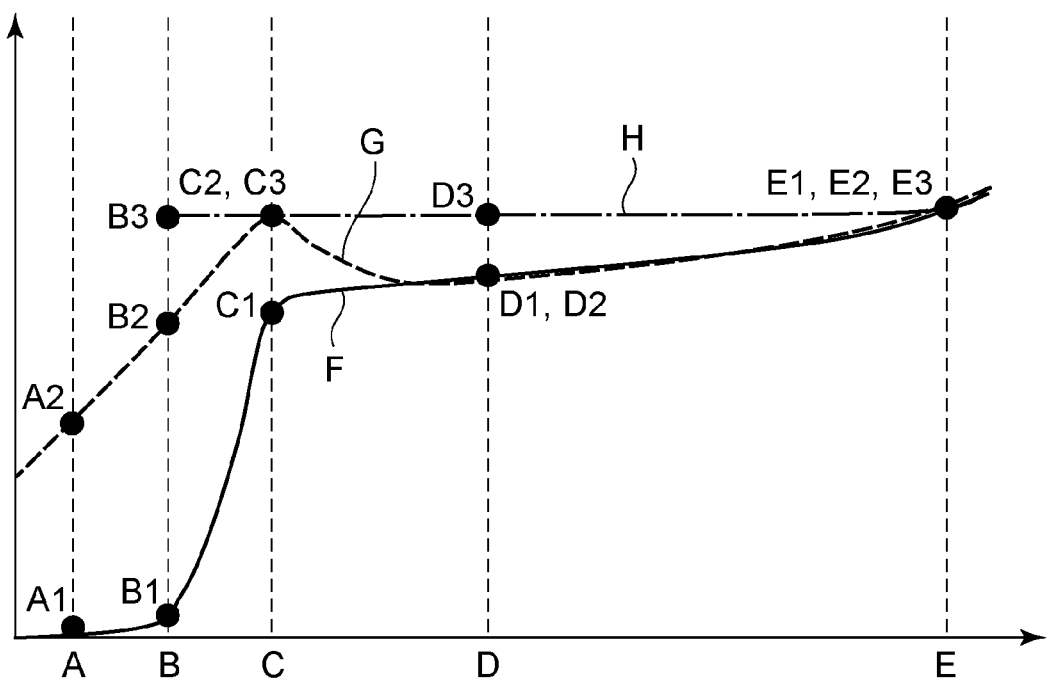
FIG. 8 indicates a potential distribution of a line segment in a cross-sectional view of the photoelectric conversion element according to the first embodiment.

FIG. 8 indicates a potential distribution of a line segment in a cross-sectional view of the photoelectric conversion element 102 illustrated in FIG. 6.

A dotted line G in FIG. 8 indicates the potential distribution of a line segment GG' in FIG. 6, and a solid line F in FIG. 8 indicates the potential distribution of a line segment FF' in FIG. 6. A dashed-dotted line H in FIG. 8 indicates the potential distribution of line segment HH' in FIG. 6. In FIG. 8 illustrates the potential viewed from electrons, which are the main carrier charges in the N-type semiconductor region. When the main carrier charges are holes, the relationship between high and low potentials is reversed.

In FIG. 8, let A1 denote the potential height of the solid line F at the height A, and let A2 denote the potential height of the dotted line G. In addition, let B1 denote the potential height of the solid line F at the height B, let B2 denote the potential height of the dotted line G, and let B3 denote the potential of the dashed-dotted line H. Let C1 denote the potential height of the solid line F at the height C, let C2 denote the potential height of the dotted line G, and let C3 denote the potential of the dashed-dotted line H. Let D1 denote the potential height of the solid line F at the height D, let D2 denote the potential height of the dotted line G, and let D3 denote the potential of the dashed-dotted line H. Let E1 denote the potential height of the solid line F at the height E, let E2 denote the potential height of the dotted line G, let E3 denote the potential height of the dashed-dotted line H.

As can be seen from FIGS. 6 and 8, the potential height of the first semiconductor region 311 corresponds to A1, and the potential height near the center of the second semiconductor region 312 corresponds to C1. The potential height of the third semiconductor region 313 corresponds to D2, and the potential height of the outer edge of the second semiconductor region 312 corresponds to C2.

In terms of the dotted line G in FIG. 8, the potential gradually decreases from the height E to height D. Then, the potential gradually increases from the height D toward the height C. At the height C, the potential reaches the C2 level. Furthermore, the potential decreases from the height C toward the height A, and the potential reaches the A2 level at the height A.

In contrast, in terms of the solid line F, the potential gradually decreases from the height E to the height D and from the height D to the height C. At the height C, the potential reaches the C1 level. Then, the potential sharply drops from the height C toward the height A. At the height A, the potential reaches the A1 level. At the height D, the potentials of the dotted line G and the solid line F are approximately at the same height, and in the region indicated by the line segment FF' and the line segment GG', the potential has a potential gradient so as to gradually decrease toward the second surface of the semiconductor layer 301. Therefore, charges generated in a photoelectric conversion element move toward the second surface due to the gentle potential gradient.

The dashed-dotted line H maintains an almost constant potential height from the height E to height B.

At this time, in the avalanche diode according to the present embodiment, the P-type second semiconductor region 312 has a lower N-type impurity concentration than the N-type first semiconductor region 311, and reverse bias potentials are supplied to the first semiconductor region 311 and the second semiconductor region 312.

For this reason, a depletion layer region is formed adjacent to the second semiconductor region 312. The second semiconductor region 312 serves as a potential barrier for the charges photoelectrically converted in the seventh semiconductor region 317 and, thus, a structure is formed in which charges are easily collected by the first semiconductor region 311.

In FIG. 6, the second semiconductor region 312 is formed over the entire surface of the photoelectric conversion element. However, the portion that overlaps the first semiconductor region 311 in plan view may be an N-type semiconductor region without providing the second semiconductor region 312 that is a P-type semiconductor region. The impurity concentration of the N-type semiconductor region is set lower than that of the first semiconductor region 311. When an N-type semiconductor layer is used, a configuration needs to be employed in which the second semiconductor region 312 is not provided in the portion that overlaps the first semiconductor region 311 in plan view. In this case, it can be considered that the seventh semiconductor region 317 having a slit is formed. In this case, due to the potential difference between the second semiconductor region 312 and the slit portion, the potential decreases in a direction from the line segment GG' to the line segment FF' at the height C illustrated in FIG. 6. This facilitates the movement of charges toward the first semiconductor region 311 when the charges photoelectrically converted in the seventh semiconductor region 317 move.

In contrast, when the second semiconductor region 312 is formed over the entire surface as illustrated in FIG. 6, the voltage applied to obtain a strong electric field required for avalanche multiplication can be decreased as compared with the case where a slit is formed. Thus, noise caused by the formation of a locally strong electric field region can be prevented.

The charge that has moved to the vicinity of the second semiconductor region 312 is accelerated by the steep potential gradient from the height C to height A of the solid line F illustrated in FIG. 8, that is, by a strong electric field. Thus, the charge is avalanche-multiplied.

However, between the third semiconductor region 313 and the P-type second semiconductor region 312 illustrated in FIG. 6, that is, from the height D to the height C of the dotted line G illustrated in FIG. 8, the potential distribution that does not cause avalanche multiplication is formed. Consequently, charges generated in the seventh semiconductor region 317 can be counted as signal charges without increasing the area of the strong electric field region (an avalanche multiplication region) with respect to the size of the photodiode. While the description above has been made with reference to the N-type third semiconductor region 313, the third semiconductor region 313 may be a P-type semiconductor region as long as the concentration satisfies the above-described potential relationship.

In addition, the charges photoelectrically converted in the second semiconductor region 312 flow into the seventh semiconductor region 317 due to the potential gradient from the height D to the height C of the dotted line G illustrated in FIG. 8. The charges in the seventh semiconductor region 317 easily move to the second semiconductor region 312 for the reasons described above. Therefore, the charges photoelectrically converted in the second semiconductor region 312 move to the first semiconductor region 311 and are detected as signal charges by avalanche multiplication. Therefore, the photoelectric conversion apparatus has sensitivity to the charges photoelectrically converted in the second semiconductor region 312.

The dotted line G in FIG. 8 indicates the cross-sectional potential of the line segment GG' in FIG. 3. Let A2 denote an intersection point of the dotted line G where the height A in FIG. 6 intersects with the line segment GG', let B2 denote an intersection point of the dotted line G where the height B intersects with the line segment GG', let C2 denote an intersection point of the dotted line G where the height C intersects with the line segment GG', and let D2 denote an intersection point of the dotted line G where the height D intersects with the line segment GG'. Electrons photoelectrically converted in the seventh semiconductor region 317 illustrated in FIG. 6 move from the potentials D2 to C2 in FIG. 8. Then, the electrons cannot go over the potential C2 toward potential B2 since the section from C2 to B2 serves as potential barrier. Therefore, the electrons move to the vicinity of the center denoted by the line segment FF' in the seventh semiconductor region 317 in FIG. 6. The moved electrons move along the potential gradients from potential D1 to potential B1 in FIG. 8. The electrons are avalanche-multiplied by the steep potential gradient from the potential B1 to potential A1, pass through the first semiconductor region 311, and are detected as signal charges.

In addition, charges generated near the boundary between the eighth semiconductor region 318 and the sixth semiconductor region 316 in FIG. 6 move along the potential gradient from the potential B2 to potential C2 in FIG. 8. Thereafter, as described above, the charges move to the vicinity of the center denoted by the line segment FF' of the seventh semiconductor region 317 in FIG. 6. Then, the charges are avalanche-multiplied due to a steep potential gradient from potential B1 to potential A1.

The avalanche-multiplied charges are detected as signal charges after passing through the first semiconductor region 311.

Figure 9:
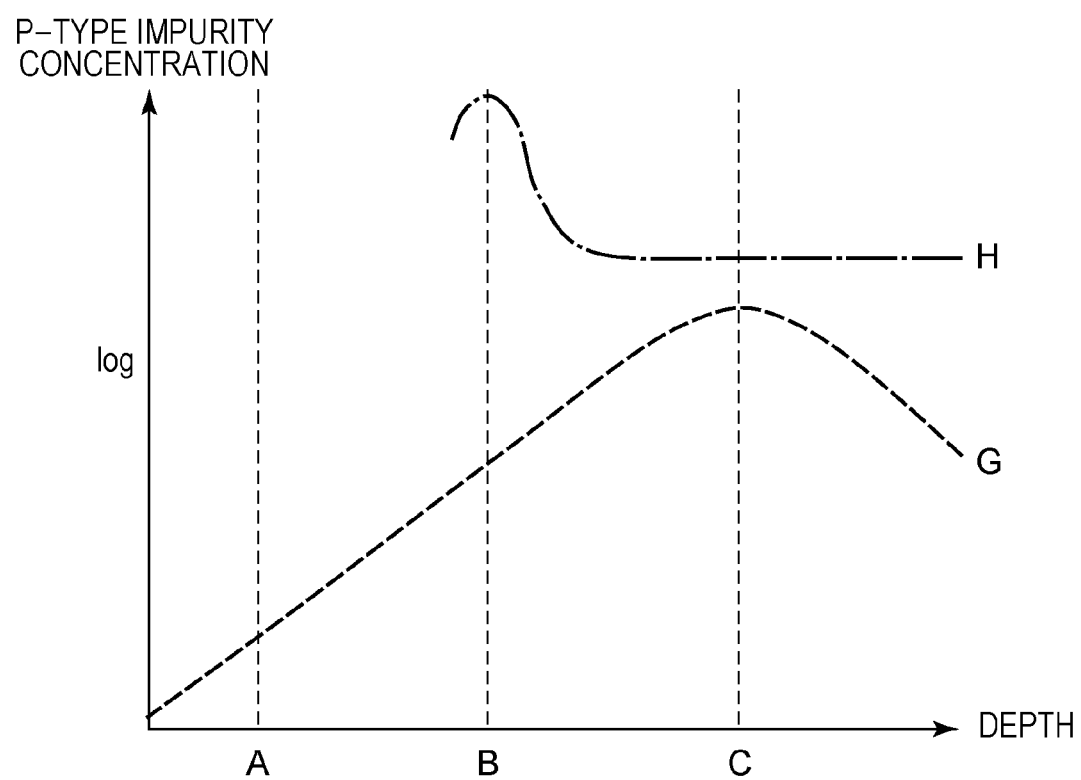
FIG. 9 is a diagram illustrating the impurity concentration of the photoelectric conversion element according to the first embodiment.

FIG. 9 illustrates the distribution of impurity concentrations in the line segments GG' and HH' illustrated in FIG. 6. A dotted line G corresponds to the line segment GG', and a dashed-dotted line H corresponds to the line segment HH'. The lines G and H indicate impurity concentrations at depths A, B, and C in the photoelectric conversion element 102. The ordinate in FIG. 9 represents the P-type impurity concentration.

The P-type impurity concentration of the line segment GG' indicates the peak value at the depth C where the second semiconductor region 312 is provided. The P-type impurity concentration decreases from the depth C to depth A.

In the line segment HH', the P-type impurity concentration is substantially constant at the depth where a fifth semiconductor region 315 is provided. Since the second contact electrode 319 provided at the depth B is a dense P-type region, the impurity concentration peak occurs at the depth B.

The second contact electrode 319 is provided on a trench structure having a bottom surface that is the third surface between the first surface (the light incident surface) and the second surface (the surface opposite the light incident surface) of the semiconductor substrate. That is, the depth of the third surface with respect to the second surface is determined by the depth of the trench structure. If the third surface is provided at a position closer to the first surface than the second semiconductor region 312, the dark electrons generated around the second contact electrode 319 are more likely to flow to a sensitivity region adjacent to the first surface than to the second semiconductor region 312. Since the dark electrons flowing into the sensitivity region are avalanche-multiplied, the DCR may deteriorate.

Therefore, according to the present embodiment, the second semiconductor region 312 is provided closer to the first surface than a contact face between the second contact electrode 319 and the semiconductor layer. That is, the third surface of the semiconductor substrate is positioned at a depth between the second surface and the second semiconductor region 312 so that the contact face between the second contact electrode 319 and the semiconductor layer is positioned at a depth between the second surface and the second semiconductor region 312. According to the structure, the dark electrons generated around the second contact electrode are absorbed by the first semiconductor region 311 without passing through the PN junction where avalanche multiplication occurs, so that deterioration of DCR can be prevented.

Second Embodiment

A photoelectric conversion apparatus according to the second embodiment is described below with reference to FIG. 10.

Descriptions that are common to the first embodiment are omitted, and differences from the first embodiment are mainly described below. According to the present embodiment, the second semiconductor region 312 is provided as a wide member having a depth that is greater than in the first embodiment.

Figure 10:
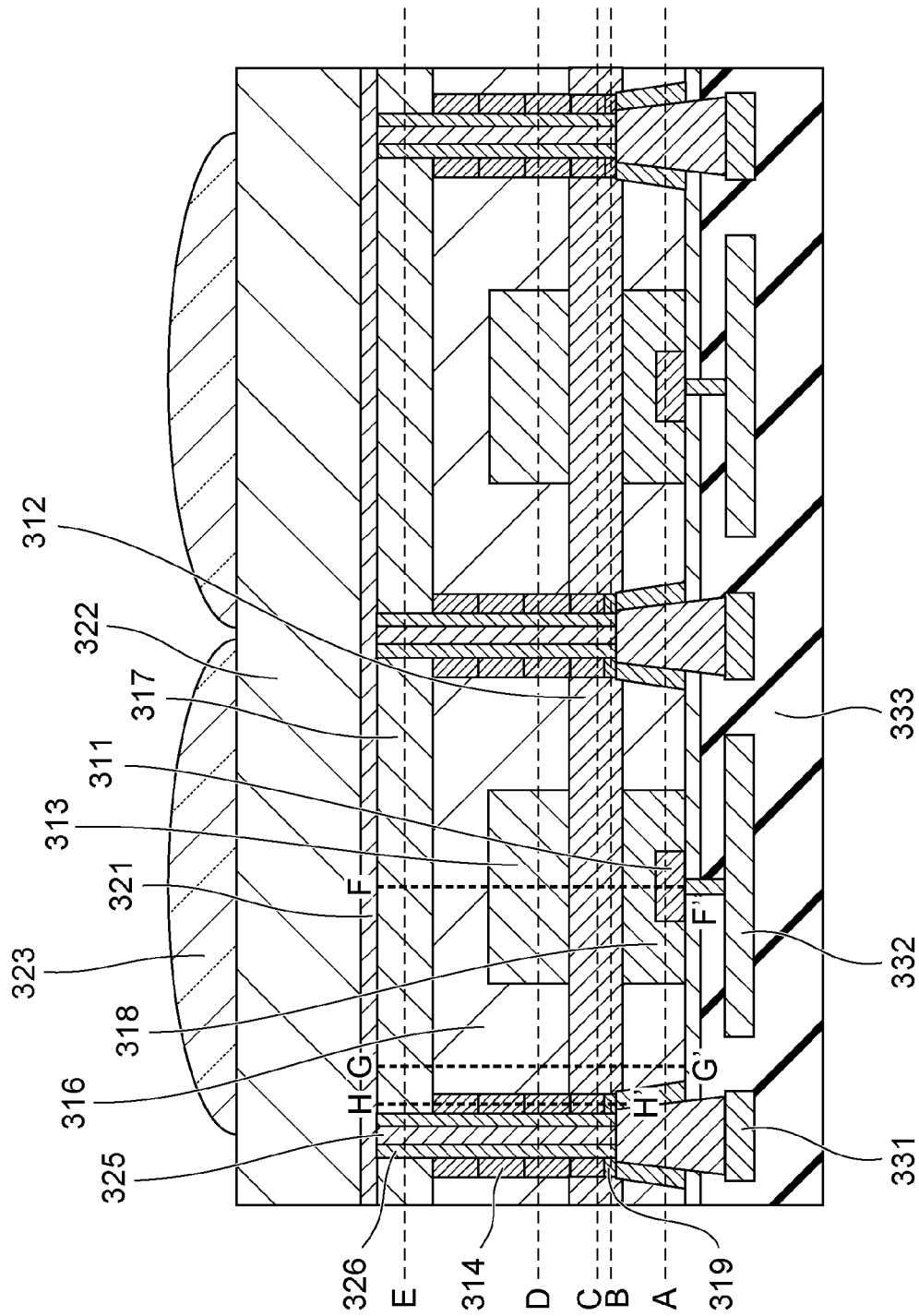
FIG. 10 is a cross-sectional view of a photoelectric conversion element according to a second embodiment.

FIG. 10 is a cross-sectional view of two pixels of the photoelectric conversion element 102 of the photoelectric conversion apparatus according to the second embodiment, taken in the direction perpendicular to the surface direction of the substrate.

According to the first embodiment, the second contact electrode 319 is disposed between the second semiconductor region 312 and the second surface. According to the present embodiment, the second contact electrode 319 is provided at a depth so as to partially overlap the second semiconductor region 312. The location where the second contact electrode 319 is provided is closer to the second surface than the impurity concentration peak position of the P-type impurity of the second semiconductor region 312. That is, according to the present embodiment, the second contact electrode 319 is provided between the impurity concentration peak position of the second semiconductor region 312 and the second surface.

The case is discussed below where in the photoelectric conversion element 102 according to the first embodiment, the second contact electrode 319 is formed closer to the first surface in order to ensure the distance between the second contact electrode and the first semiconductor region 311. Since the second contact electrode 319 is provided between the second surface and the second semiconductor region 312, the location of the second semiconductor region 312 comes closer to the first surface as the location of the second contact electrode 319 comes close to the first surface. At this time, a distance occurs between the second semiconductor region 312 and the first semiconductor region 311, making it difficult to form a PN junction having a steep potential gradient between the second semiconductor region 312 and the first semiconductor region 311.

In the configuration according to the present embodiment, when the second contact electrode 319 is provided at a depth close to the first surface, the width of the second semiconductor region 312 is increased accordingly. Since the distance between the end portion of the second semiconductor region 312 and the first semiconductor region 311 does not increase, a steep potential gradient can be formed between the semiconductor regions. In addition, since a distance occurs from the position where the second contact electrode is provided to the sensitivity region, the inflow of dark electrons into the sensitivity region can be reduced. Even when part of the second semiconductor region 312 and the second contact electrode 319 are provided at the same depth, the distance from the second contact electrode 319 to the sensitivity region is maintained. Therefore, dark electrons generated around the second contact electrode 319 are less likely to reach the sensitivity region.

As described above, by providing the second semiconductor region 312 as a wide member, formation of a PN junction between the first semiconductor region 311 and the second semiconductor region 312 is facilitated while preventing dark electrons from flowing into the sensitivity region.

Third Embodiment

A photoelectric conversion apparatus according to the third embodiment is described below with reference to FIGS. 11 to 13.

Descriptions that are common to the first and second embodiments are omitted, and the differences from the first embodiment are mainly described. According to the present embodiment, the case where a stepped second semiconductor region 312 is provided is described below.

Figure 11:
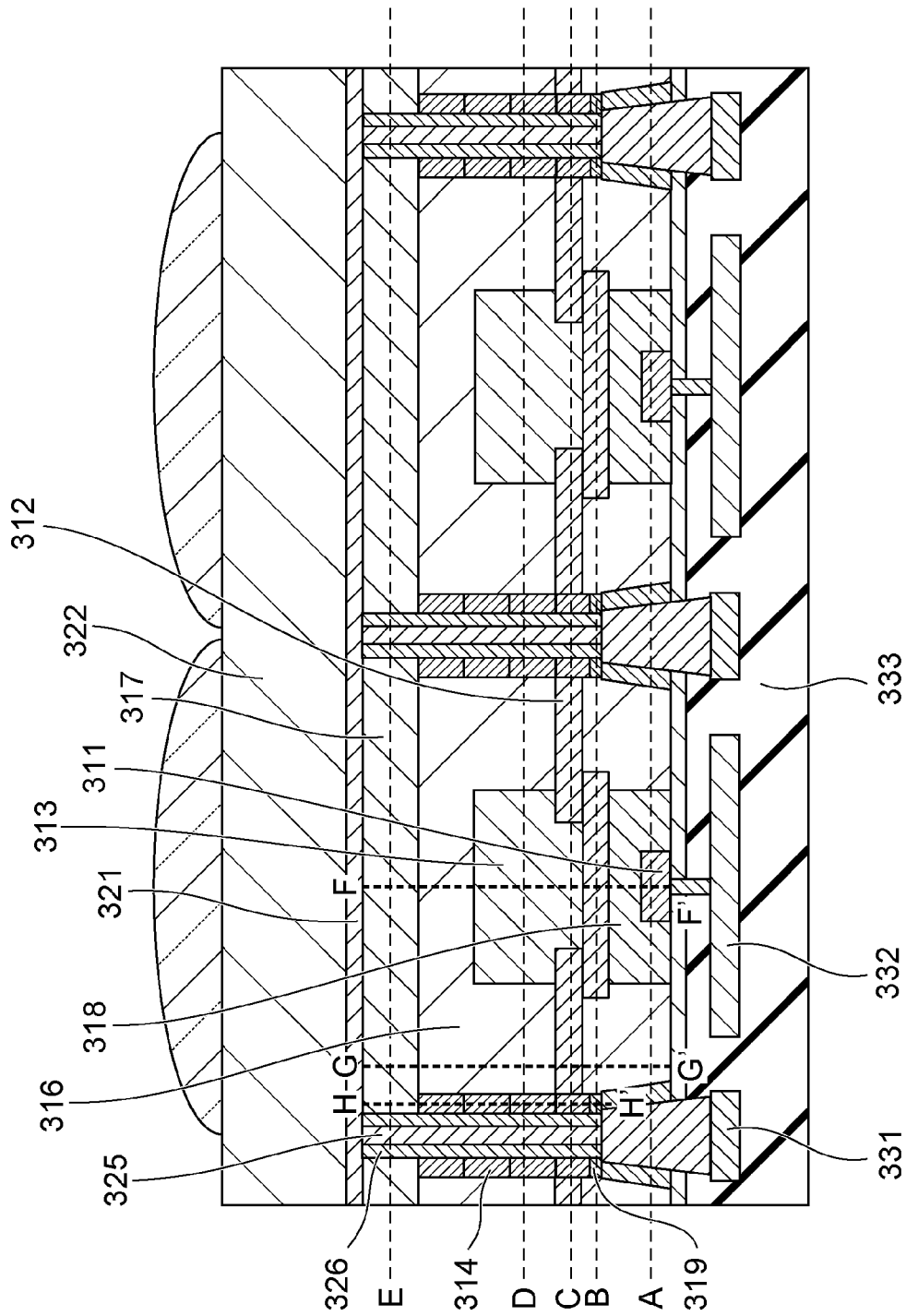
FIG. 11 is a cross-sectional view of a photoelectric conversion element according to a third embodiment.

FIG. 11 is a cross-sectional view of two pixels of the photoelectric conversion element 102 of the photoelectric conversion apparatus according to this modification, taken in the direction perpendicular to the surface direction of the substrate. According to the present embodiment, like the second embodiment, for the purpose of both reducing the inflow of dark electrons into the sensitivity region and facilitating formation of a PN junction, the stepped second semiconductor region 312 is formed.

The second semiconductor region 312 illustrated in FIG. 11 has a first portion that overlaps the first semiconductor region 311 in plan view and a second portion other than the first portion. The first portion of the second semiconductor region 312 is formed at a depth between the second portion and the second surface. In addition, a second contact electrode 319 is formed at a depth between the second portion of the second semiconductor region 312 and the second surface.

Due to the above-described shape, the second contact electrode 319 can be formed deeper into the substrate, and the second semiconductor region 312 can separate the second contact electrode 319 from the sensitivity region. Furthermore, the second semiconductor region 312 and the first semiconductor region 311 can be formed close to each other in the portion where the PN junction is formed. In FIG. 11, the second semiconductor region 312 having a two-step configuration with two heights is formed. However, three or more stepped configuration can be employed.

Figure 12:
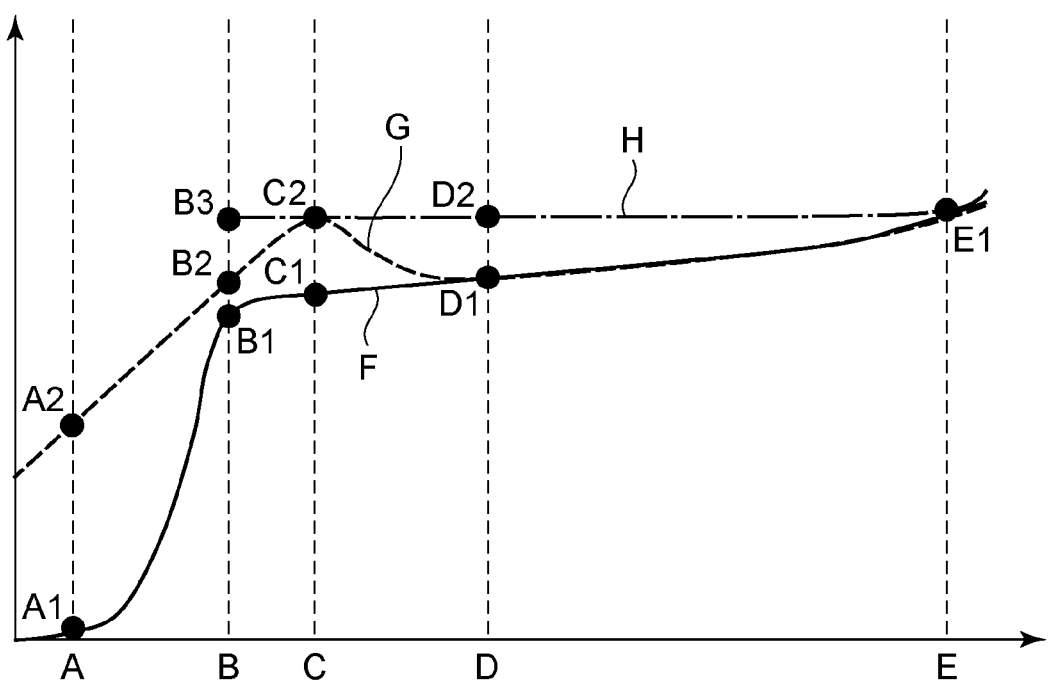
FIG. 12 indicates a potential distribution of a line segment of the photoelectric conversion element according to the third embodiment.

FIG. 12 indicates a potential distribution of a line segment of the photoelectric conversion element 102 illustrated in FIG. 11.

As illustrated in FIG. 11, the positions corresponding to the depth B and depth C are close to the second surface than in the first embodiment. Furthermore, since the distance between the first semiconductor region 311 and the second semiconductor region 312 on the line segment FF' is less than in the first embodiment, a steep potential gradient is formed at a position closer to the second surface than the depth C. Even when the second contact electrode 319 is located close to the first surface, a PN junction having a steep potential gradient can be formed between the first semiconductor region 311 and the second semiconductor region 312.

Although in FIG. 11, the second contact electrode and the first portion of the second semiconductor region 312 are formed at the same depth with respect to the second surface, either may be formed at a deeper position.

Figure 13:
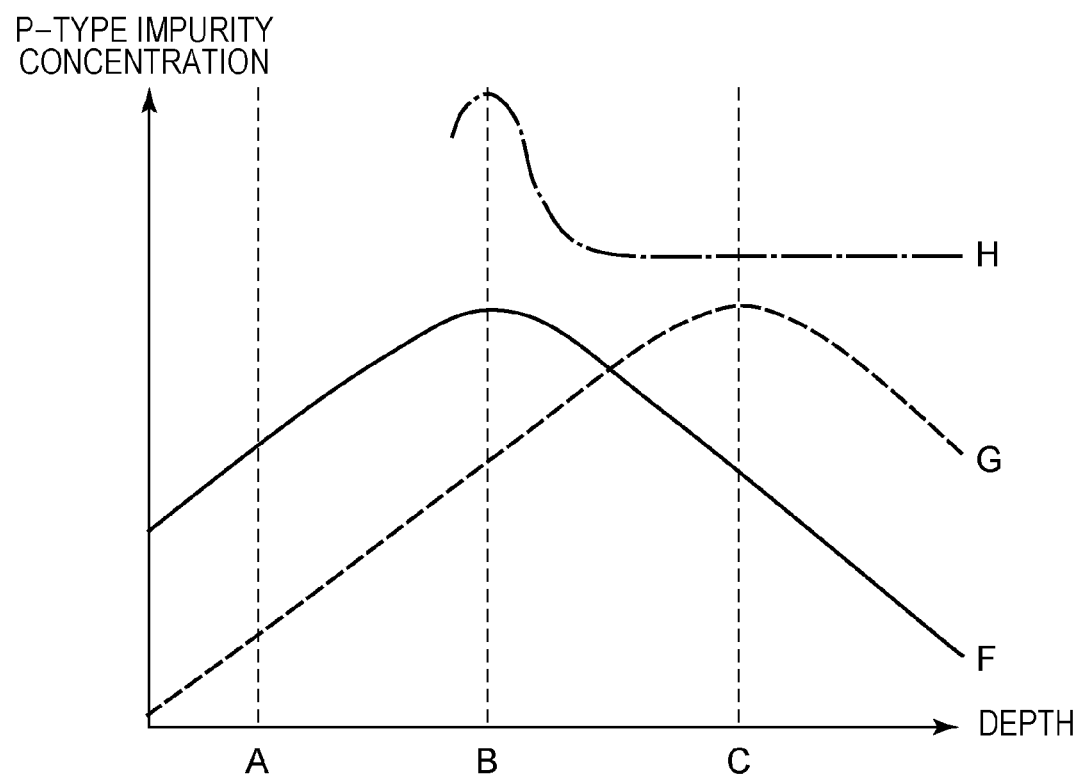
FIG. 13 is a diagram illustrating the impurity concentration of the photoelectric conversion element according to the third embodiment.

The distribution of impurity concentrations in each of the line segments FF', GG', and HH' illustrated in FIG. 11 is illustrated in FIG. 13. A solid line F corresponds to the line segment FF', a dotted line G corresponds to the line segment GG', and a dashed-dotted line H corresponds to the line segment HH'. FIG. 13 illustrates the impurity concentrations at depths A, B, and C in the photoelectric conversion element 102. The ordinate in FIG. 13 represents the P-type impurity concentration.

Since the depth of the second semiconductor region 312 differs between the central portion (the line segment FF') of the photoelectric conversion element where the first semiconductor region 311 is formed and the other portion (the line segment GG'), the impurity concentration peak position differs between the solid line F and the dotted line G.

Fourth Embodiment

A photoelectric conversion apparatus according to the fourth embodiment is described below with reference to FIGS. 14 to 16.

Descriptions that are common to the first to third embodiments are omitted, and the differences from the first embodiment are mainly described. According to the present embodiment, a thin N-type semiconductor layer (the fifth semiconductor region 315) is formed on the side wall of the trench structure for embedding the second contact electrode 319 in the substrate. The fifth semiconductor region 315 is an ejection structure for ejecting dark electrons generated around the trench structure and the second contact electrode from the first contact electrode without undergoing avalanche multiplication.

Figure 14:
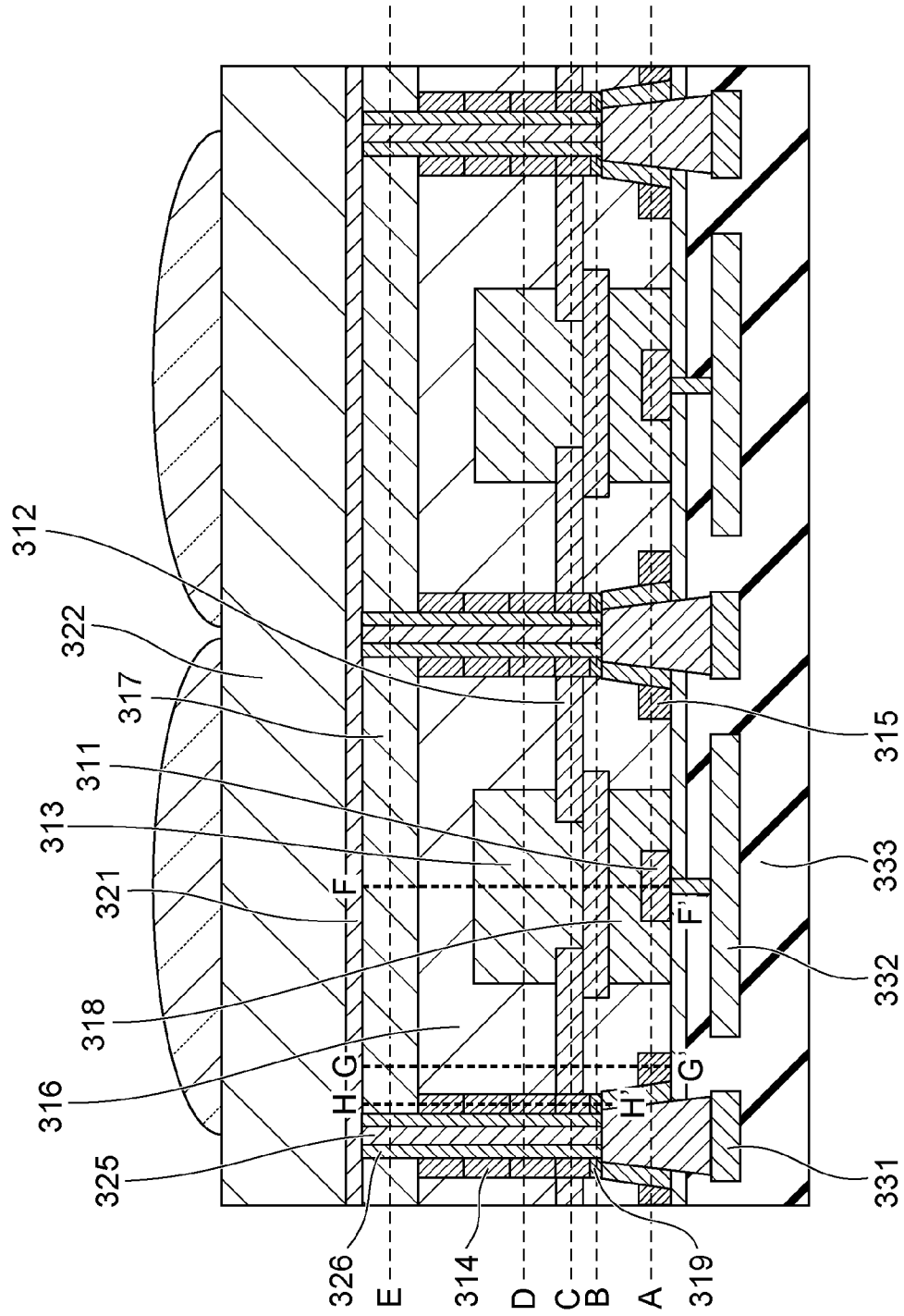
FIG. 14 is a cross-sectional view of a photoelectric conversion element according to a fourth embodiment.

FIG. 14 is a cross-sectional view of two pixels of the photoelectric conversion element 102 of the photoelectric conversion apparatus according to the fourth embodiment, taken in a direction perpendicular to the surface direction of the substrate. FIG. 14 corresponds to an A-A' cross section in FIG. 16. As described in the first embodiment, the second contact electrode 319 is provided on a trench structure having a bottom surface which is the third surface located between the first surface (the light incident surface) and the second surface (the surface opposite the light incident surface) of the semiconductor substrate. The STI used to embed the second contact electrode 319 in the substrate may generate dark electrons on the surface thereof. Therefore, according to the present embodiment, the thin N-type fifth semiconductor region 315 is provided in contact with the side wall of the trench structure. Dark electrons generated around the trench structure and the second contact electrode are ejected from the fifth semiconductor region 315.

Figure 15:
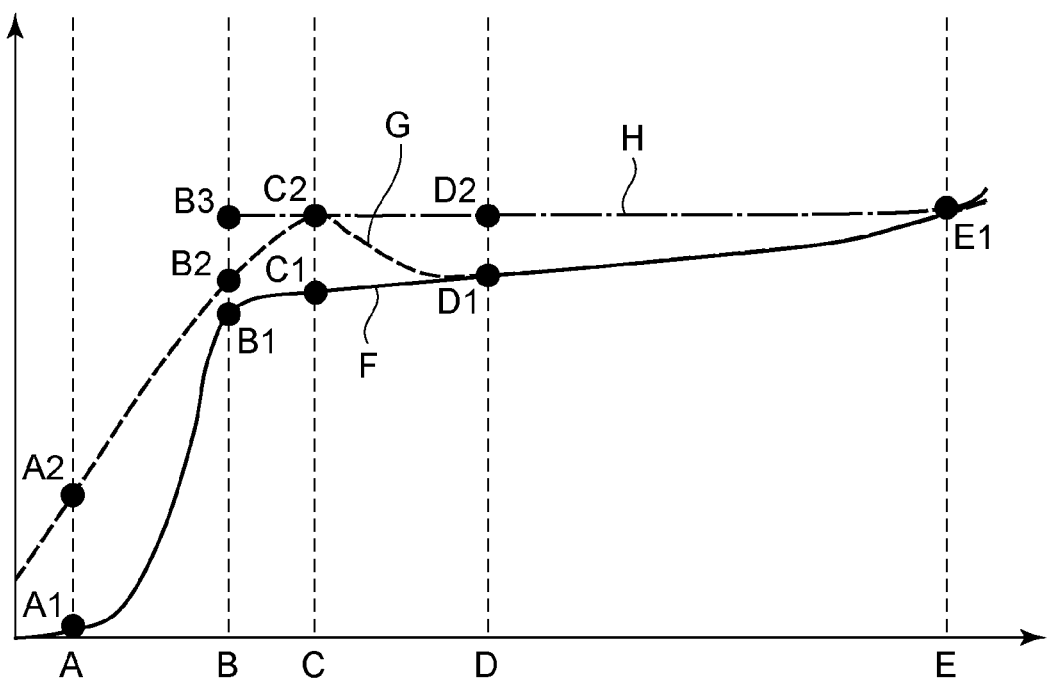
FIG. 15 indicates a potential distribution of a line segment in a cross-sectional view of a photoelectric conversion apparatus according to the fourth embodiment.

FIG. 15 indicates a potential distribution of a line segment in a cross-sectional of the photoelectric conversion element 102 illustrated in FIG. 14. As illustrated in FIG. 14, the formed ninth semiconductor region 319 reduces the potential from the height C to the second surface at a position (the line segment GG') near the outer edge of the photoelectric conversion element. As a result, the dark electrons generated in the vicinity of the second semiconductor region 312 and the second contact electrode 319 can easily move toward the second surface, thus preventing deterioration of the DCR due to the dark electrons that enter the sensitivity region. The charge that has flowed to the vicinity of the second surface is ejected from the first contact electrode, which is the cathode electrode, via the first semiconductor region 311.

Figure 16:
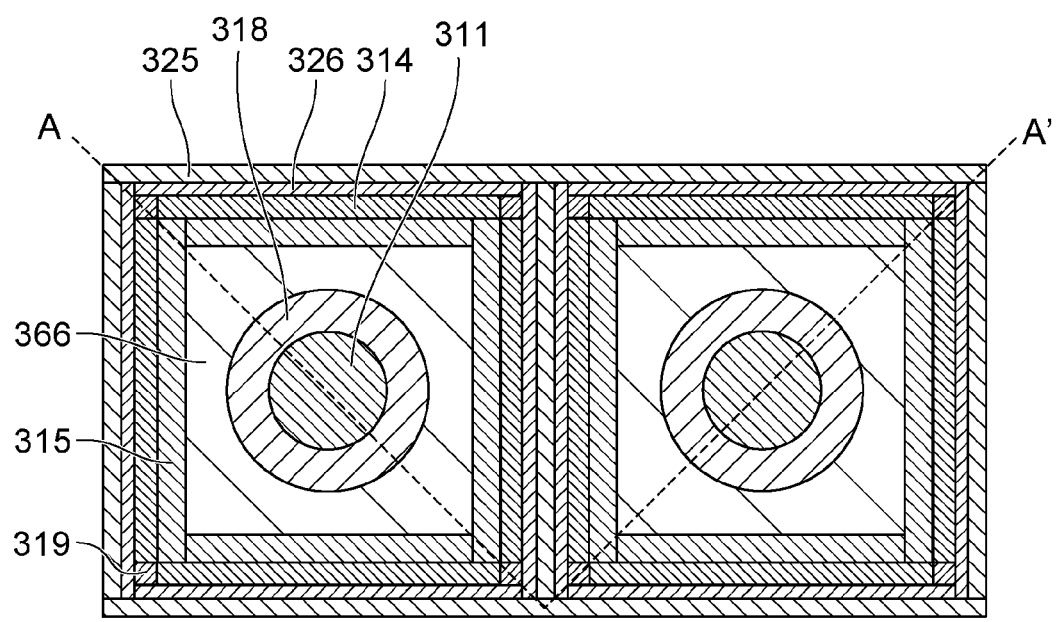
FIG. 16 is a potential diagram of the photoelectric conversion element according to the fourth embodiment.

FIG. 16 is a plan view of two pixels of the photoelectric conversion apparatus 102 according to the fourth embodiment.

As can be seen from the cross section at height A illustrated in FIG. 16, the fifth semiconductor region 315 is formed around the trench structure having the second contact electrode 319 provided therein.

By providing such an ejection structure, the pixel structure prevents dark electrons from entering the sensitivity region and facilitates ejection of dark electrons to the cathode electrode. Thus, the effect of reducing the DCR can be obtained.

Fifth Embodiment

A photoelectric conversion apparatus according to the fifth embodiment is described below with reference to FIGS. 17 and 18.

Descriptions that are common to the first to fourth embodiments are omitted, and the differences from the fourth embodiment are mainly described. According to the fourth embodiment, the N-type fifth semiconductor region 315 is formed on the side wall of the trench structure. However, according to the present embodiment, the fifth semiconductor region 315 is extended to the eighth semiconductor region 318.

Figure 17:
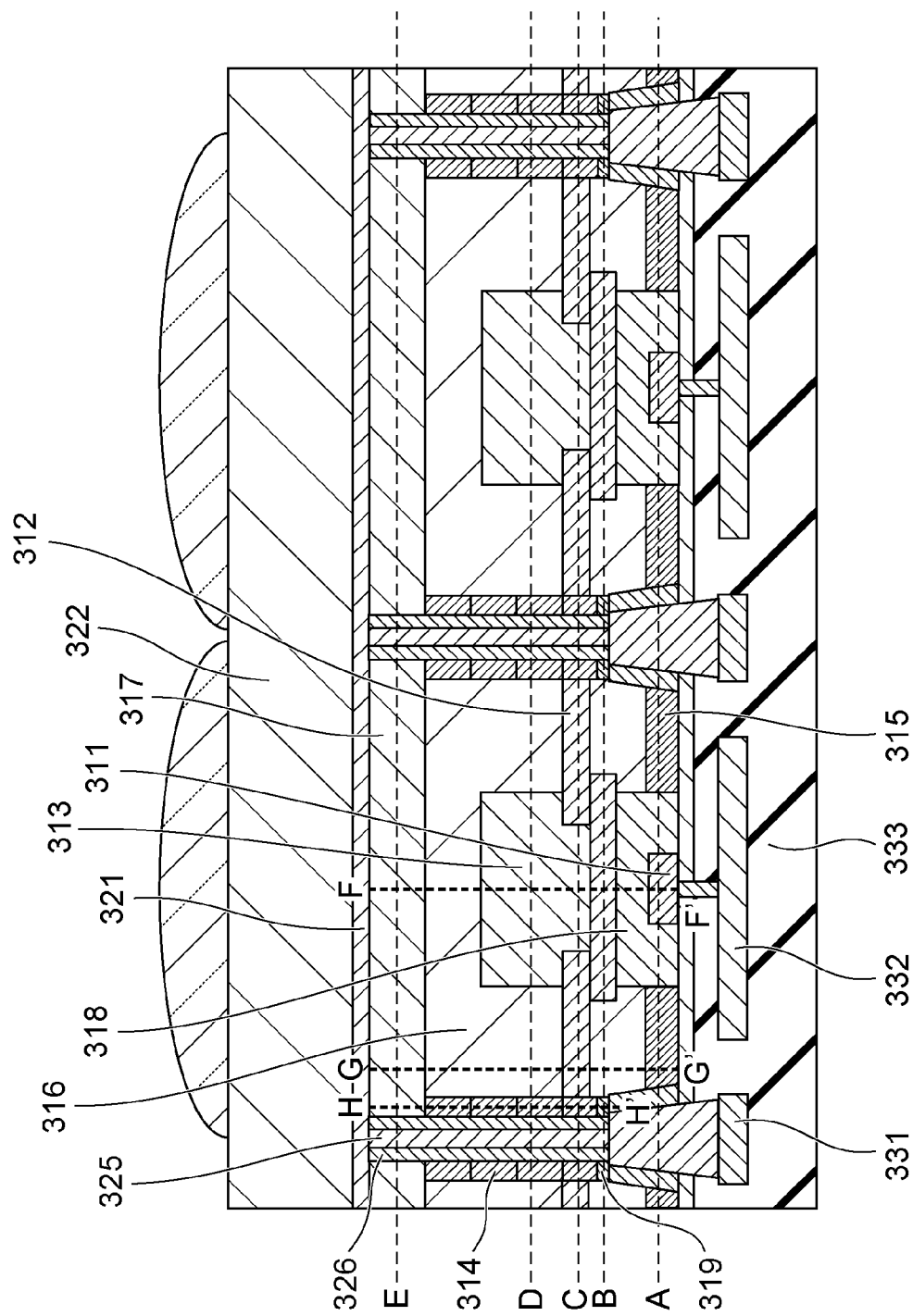
FIG. 17 is a cross-sectional view of a photoelectric conversion element according to a fifth embodiment.

FIG. 17 is a cross-sectional view of the photoelectric conversion element 102 of the photoelectric conversion apparatus according to the fifth embodiment, taken in a direction perpendicular to the surface direction of the semiconductor layer. FIG. 17 corresponds to an A-A' cross section in FIG. 18. In the photoelectric conversion apparatus according to the present embodiment, the fifth semiconductor region 315 provided on the side wall of the trench structure having the second contact electrode 319 provided therein is extended to the eighth semiconductor region 318 provided around the first semiconductor region 311. That is, an electron path is formed by an N-type region from the vicinity of the second contact electrode 319 to the first semiconductor region 311.

Figure 18:
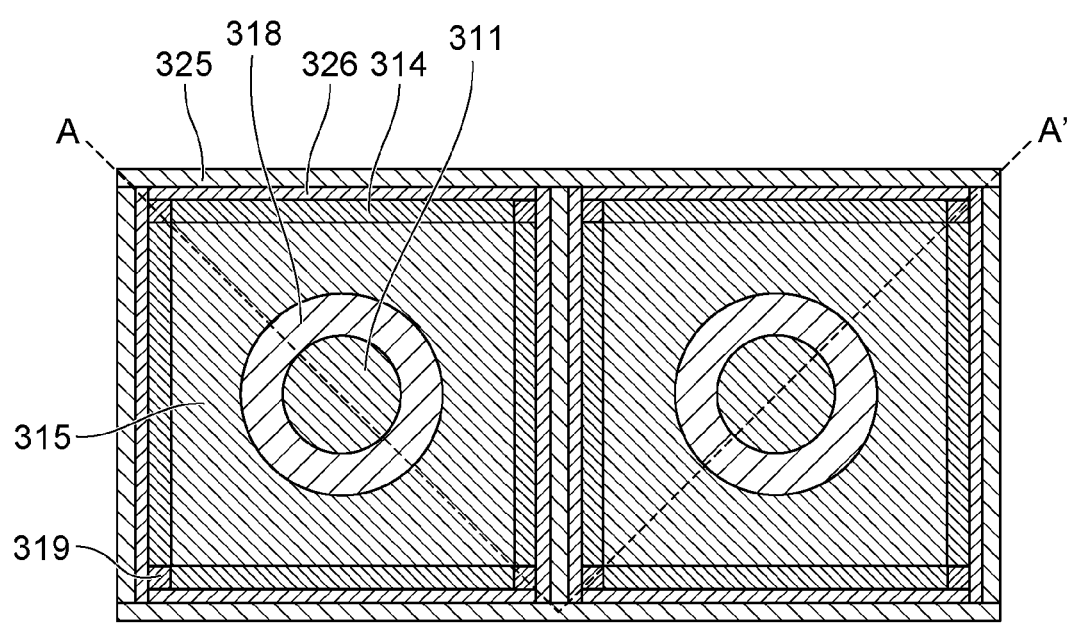
FIG. 18 is a plan view of the photoelectric conversion element according to the fifth embodiment.

FIG. 18 is a plan view of two pixels of the photoelectric conversion apparatus according to the fifth embodiment. In FIG. 16, the fifth semiconductor region 315 is formed around the trench structure having the second contact electrode 319 provided therein. However, in FIG. 18, the fifth semiconductor region 315 is formed from the outer peripheral portion of the photoelectric conversion element to the end portion of the eighth semiconductor region 318.

Due to the configuration, the effect of reducing the DCR more can be obtained.

Sixth Embodiment

Figure 19:
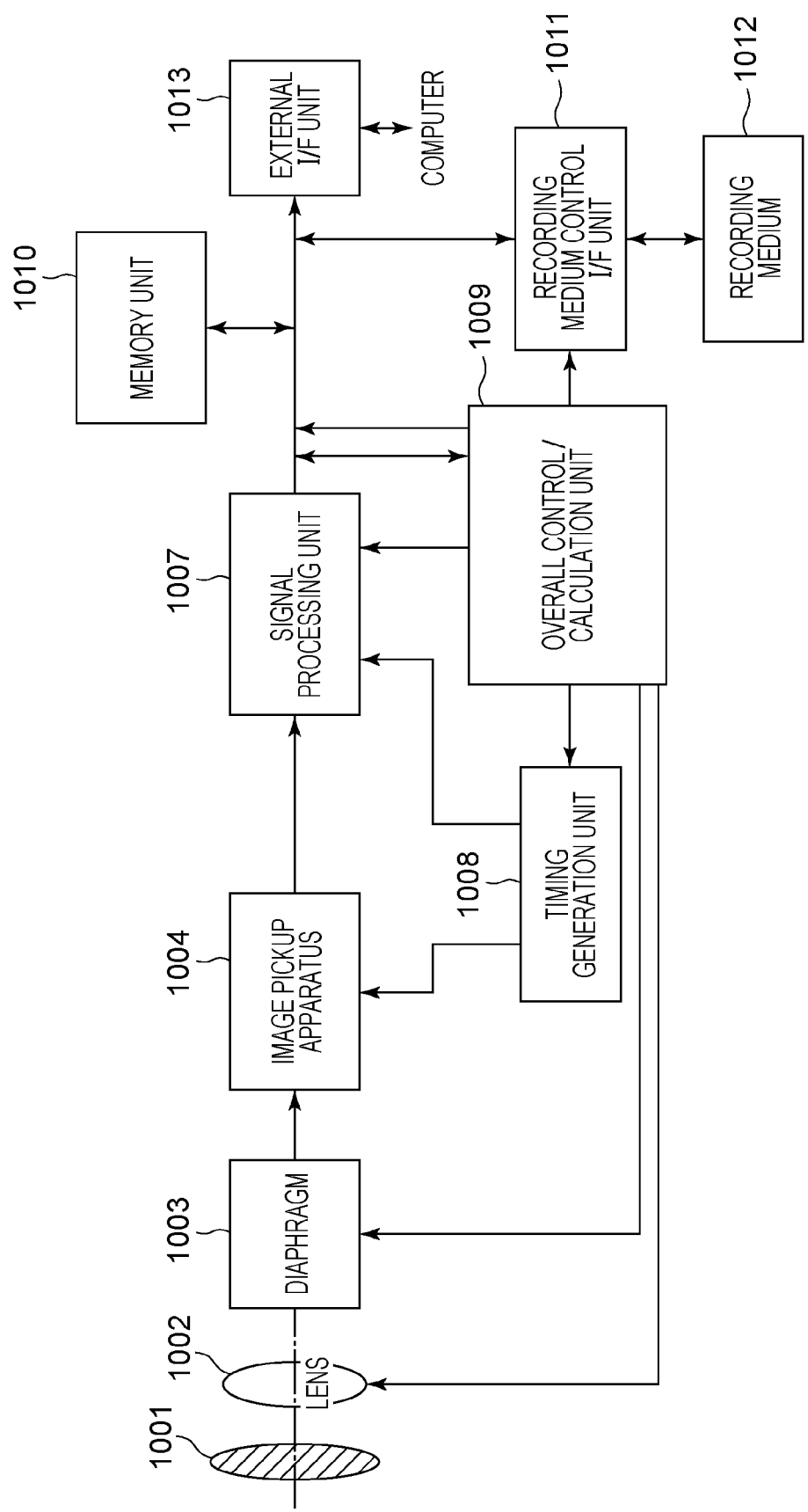
FIG. 19 is a functional block diagram of a photoelectric conversion system according to a sixth embodiment.

A photoelectric conversion system according to the present embodiment is described below with reference to FIG. 19. FIG. 19 is a block diagram illustrating a schematic configuration of a photoelectric conversion system according to the present embodiment.

The photoelectric conversion apparatuses described in each of the first to sixth embodiments can be applied to a variety of photoelectric conversion systems. Examples of an applicable photoelectric conversion system include a digital still camera, a digital camcorder, a surveillance camera, a copying machine, a facsimile, a mobile phone, on-vehicle camera, and an observation satellite. In addition, a camera module including an optical system, such as a lens, and an image pickup apparatus is included in the photoelectric conversion systems. FIG. 19 is a block diagram of a digital still camera as an example of the photoelectric conversion system.

The photoelectric conversion system illustrated in FIG. 19 includes an image pickup apparatus 1004 that is an example of a photoelectric conversion apparatus and a lens 1002 that forms an optical image of an object on the image pickup apparatus 1004. The photoelectric conversion system further includes a diaphragm 1003 for controlling the amount of light passing through the lens 1002 and a barrier 1001 for protecting the lens 1002. The lens 1002 and the diaphragm 1003 form an optical system for collecting light onto the image pickup apparatus 1004. The image pickup apparatus 1004 is the photoelectric conversion apparatus according to any one of the above-described embodiments. The image pickup apparatus 1004 converts an optical image formed by the lens 1002 into an electrical signal.

The photoelectric conversion system further includes a signal processing unit 1007 that serves as an image generation unit that generates an image by processing an output signal output from the image pickup apparatus 1004. The signal processing unit 1007 performs various corrections and compressions as necessary and outputs image data. The signal processing unit 1007 may be formed in a semiconductor substrate having the image pickup apparatus 1004 provided therein or may be formed in a semiconductor substrate other than the semiconductor substrate having the image pickup apparatus 1004 therein.

The photoelectric conversion system further includes a memory unit 1010 for temporarily storing image data and an external interface unit (external I/F unit) 1013 for communicating with an external computer or the like. Still furthermore, the photoelectric conversion system includes a recording medium 1012, such as a semiconductor memory, for recording and reading image data therein and therefrom, and a recording medium control interface unit (recording medium control I/F unit) 1011 for recording or reading data in and from the recording medium 1012. The recording medium 1012 may be built in the photoelectric conversion system or may be removable.

Furthermore, the photoelectric conversion system includes an overall control/calculation unit 1009 that performs control of various calculations and overall control of the digital still camera and a timing generation unit 1008 that outputs various timing signals to the image pickup apparatus 1004 and the signal processing unit 1007. The timing signal and the like may be input from the outside, and the photoelectric conversion system can include at least the image pickup apparatus 1004 and the signal processing unit 1007 that processes the output signal output from the image pickup apparatus 1004.

The image pickup apparatus 1004 outputs an image pickup signal to the signal processing unit 1007. The signal processing unit 1007 performs predetermined signal processing on the image pickup signal output from the image pickup apparatus 1004 and outputs image data. The signal processing unit 1007 generates an image using the image pickup signal.

As described above, according to the present embodiment, a photoelectric conversion system that employs the photoelectric conversion apparatus (the image pickup apparatus) of any one of the above-described embodiments can be achieved.

Seventh Embodiment

Figure 20A:
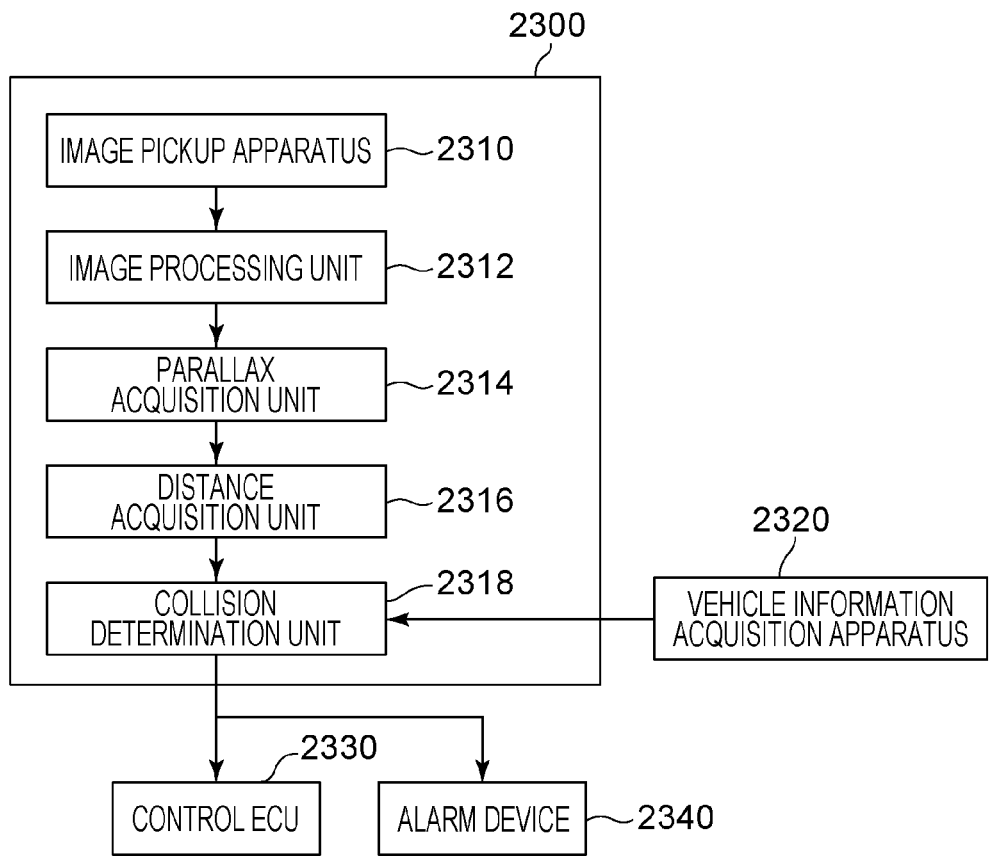
FIG. 20A is a functional block diagram of a photoelectric conversion system according to a seventh embodiment.
Figure 20B:
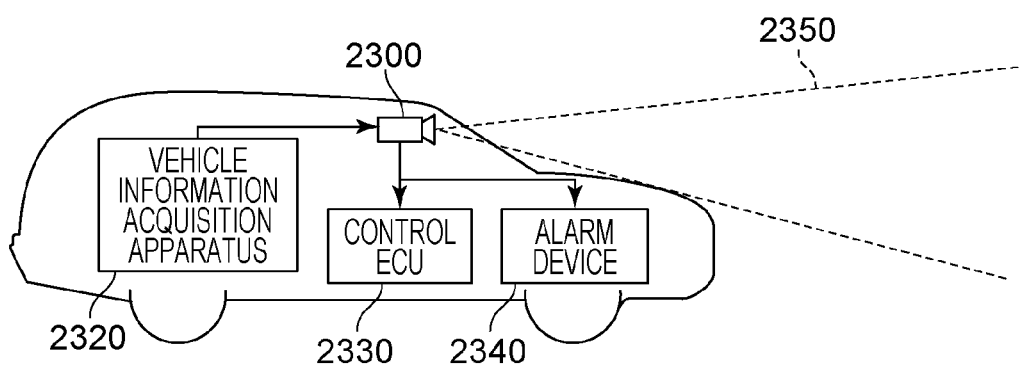
FIG. 20B illustrates a photoelectric conversion system for capturing the image of the front view of the vehicle.

A photoelectric conversion system and a mobile object according to the present embodiment are described below with reference to FIGS. 20A and 20B. FIGS. 20A and 20B are diagrams illustrating the configurations of the photoelectric conversion system and the mobile object according to the present embodiment.

FIG. 20A illustrates an example of the photoelectric conversion system for an on-vehicle camera. A photoelectric conversion system 2300 includes an image pickup apparatus 2310. The image pickup apparatus 2310 is the photoelectric conversion apparatus described in any one of the above-described embodiments. The photoelectric conversion system 2300 includes an image processing unit 2312 that performs image processing on a plurality of image data acquired by the image pickup apparatus 2310 and a parallax acquisition unit 2314 that calculates a parallax (the phase difference of a parallax image) from the plurality of image data acquired by the photoelectric conversion system 2300. The photoelectric conversion system 2300 further includes a distance acquisition unit 2316 that calculates the distance to the object on the basis of the calculated parallax and a collision determination unit 2318 that determines the collision probability on the basis of the calculated distance. The parallax acquisition unit 2314 and the distance acquisition unit 2316 are examples of distance information acquisition units for acquiring information regarding the distance to a physical object. That is, the distance information is information related to a parallax, a defocus amount, the distance to a physical object, and the like. The collision determination unit 2318 may use any one of these pieces of distance information to determine the collision probability. The distance information acquisition unit may be implemented by dedicatedly designed hardware or may be implemented by a software module.

Alternatively, the distance information acquisition unit may be implemented by a field programmable gate array (FPGA), an application specific integrated circuit (ASIC), or combinations thereof.

The photoelectric conversion system 2300 is connected to a vehicle information acquisition apparatus 2320. Thus, the photoelectric conversion system 2300 can acquire vehicle information, such as a vehicle speed, a yaw rate, and a steering angle. In addition, the photoelectric conversion system 2300 is connected to a control ECU 2330 which is a control unit that outputs a control signal for generating a braking force to the vehicle on the basis of the determination result of the collision determination unit 2318. Furthermore, the photoelectric conversion system 2300 is connected to an alarm device 2340 that emits an alarm to a driver on the basis of the determination result of the collision determination unit 2318. For example, if the collision determination unit 2318 determines that the collision probability is high, the control ECU 2330 performs vehicle control to avoid collisions or reduce damage by braking, releasing the accelerator pedal, or reducing the engine output. The alarm device 2340 emits an alarm by, for example, sounding the alarm, displaying alarm information on a screen of a car navigation system, or vibrating a seat belt or steering wheel.

According to the present embodiment, the photoelectric conversion system 2300 captures the image of the surroundings of the vehicle, for example, the front view or rear view of the vehicle. FIG. 20B illustrates a photoelectric conversion system for capturing the image of the front view of the vehicle (an image capture range 2350). The vehicle information acquisition apparatus 2320 sends an instruction to the photoelectric conversion system 2300 or the image pickup apparatus 2310. Such a configuration can improve the accuracy of distance measurement.

While an example of performing control so as not to collide with another vehicle has been described, the configuration can also be applied to control of self-driving vehicles to follow another vehicle or control of self-driving vehicles to keep the lane. Furthermore, the photoelectric conversion system can be applied to autonomous driving control for, for example, following another vehicle and keeping the lane. Furthermore, the photoelectric conversion system can be applied not only to a vehicle, such as one's own vehicle, but also to a mobile object (a moving apparatus), such as a boat, an aircraft, or an industrial robot. Still furthermore, the photoelectric conversion system can be applied not only to a mobile object but also to equipment that uses object recognition over a wide area, such as an intelligent transportation system (ITS).

Eighth Embodiment

A photoelectric conversion system according to the present embodiment is described with reference to FIG. 21. FIG. 21 is a block diagram illustrating a configuration example of a range image sensor, which is the photoelectric conversion system of the present embodiment.

As illustrated in FIG. 21, a range image sensor 401 includes an optical system 407, a photoelectric conversion apparatus 403, an image processing circuit 404, a monitor 405, and a memory 406. The range image sensor 401 receives light (modulated light or pulsed light) projected from the light source device 411 toward an object and reflected by the surface of an object and, thus, can obtain a range image in accordance with the distance to the object.

The optical system 407 includes one or more lenses. The optical system 407 guides image light (incident light) from the object to the photoelectric conversion apparatus 403 and forms an image on the light receiving surface (a sensor unit) of the photoelectric conversion apparatus 403.

As the photoelectric conversion apparatus 403, the photoelectric conversion apparatus of any one of the embodiments described above is applied, and a distance signal indicating the distance obtained from the received light signal output from the photoelectric conversion apparatus 403 is supplied to the image processing circuit 404.

The image processing circuit 404 performs image processing to construct a range image based on the distance signal supplied from the photoelectric conversion apparatus 403. The range image (image data) obtained through the image processing is supplied to the monitor 405 and is displayed. In addition, the range image is supplied to the memory 406 and is stored (recorded).

In the range image sensor 401 configured in this way, by applying the above-described photoelectric conversion apparatus, it is possible to obtain, for example, a more accurate range image in accordance with improvement of the characteristics of the pixels.

Ninth Embodiment

Figure 22:
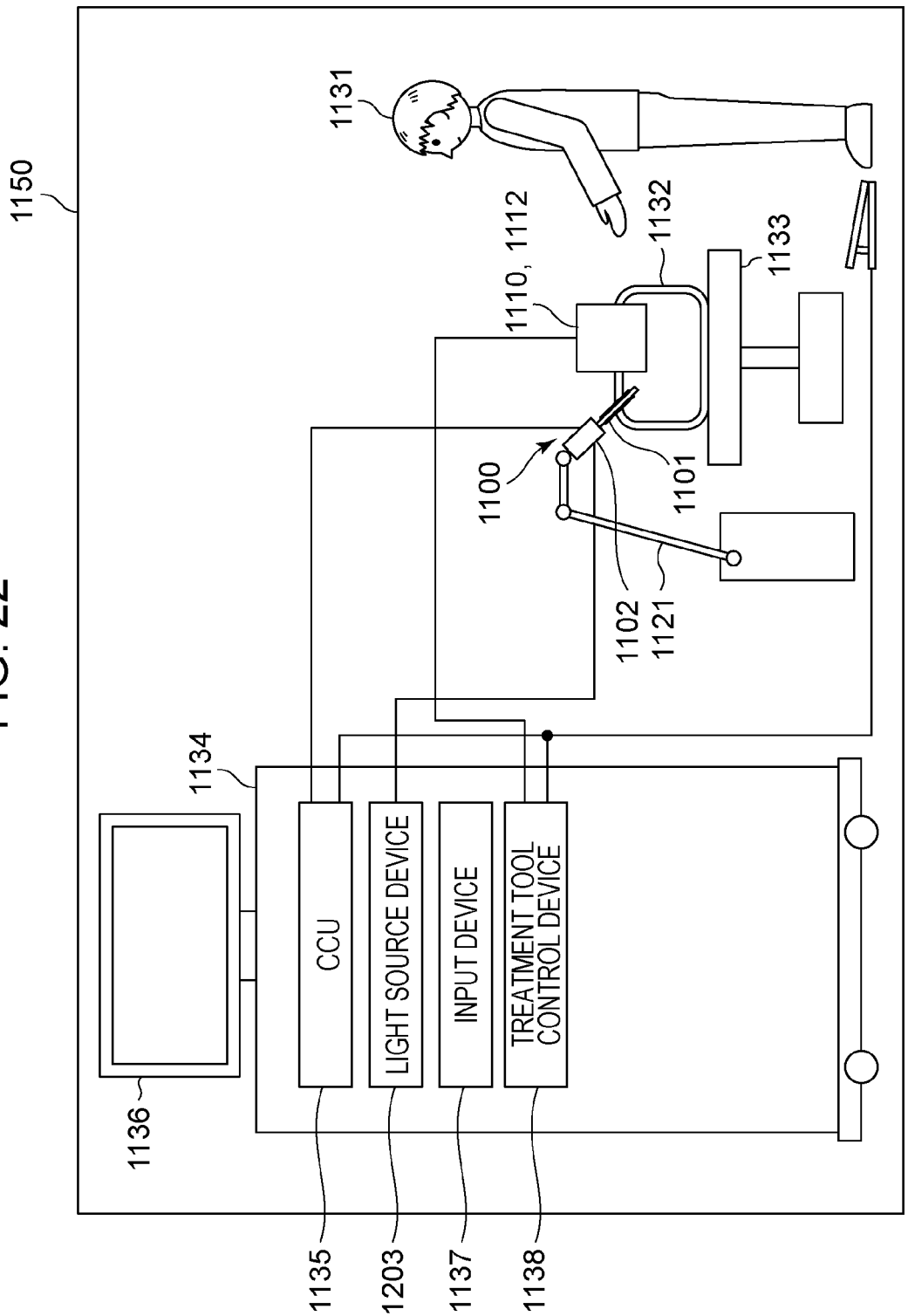
FIG. 22 is a functional block diagram of a photoelectric conversion system according to a ninth embodiment.

The photoelectric conversion system according to the present embodiment is described below with reference to FIG. 22. FIG. 22 illustrates an example of a schematic configuration of an endoscopic surgery system, which is the photoelectric conversion system according to the present embodiment.

FIG. 22 illustrates how an operator (a medical doctor) 1131 uses an endoscopic surgery system 1150 to perform surgery on a patient 1132 on a patient bed 1133. As illustrated in FIG. 22, the endoscopic surgery system 1150 includes an endoscope 1100, a surgical tool 1110, and a cart 1134 having a variety of devices for endoscopic surgery mounted therein.

The endoscope 1100 is composed of a lens barrel 1101, a predetermined length of the front end of which is to be inserted into the body cavity of the patient 1132, and a camera head 1102, which is connected to the base end of the lens barrel 1101. In FIG. 22, the endoscope 1100 is illustrated that is configured as a so-called rigid scope having the lens barrel 1101 that is rigid. However, the endoscope 1100 may be configured as a so-called flexible scope having a lens barrel that is flexible.

An opening having an objective lens fitted thereinto is provided at the front end of the lens barrel 1101. A light source device 1203 is connected to the endoscope 1100, and light generated by the light source device 1203 is guided to the front end of the lens barrel 1101 by a light guide extending inside the lens barrel 1101.

The light is emitted to an observation object in the body cavity of the patient 1132 through the objective lens. The endoscope 1100 may be a straight-viewing endoscope, an oblique-viewing endoscope, or a side-viewing endoscope.

An optical system and a photoelectric conversion apparatus are provided inside the camera head 1102, and the reflected light (observation light) from the observation object is focused on the photoelectric conversion apparatus by the optical system. The photoelectric conversion apparatus photoelectrically converts the observation light to generate an electrical signal corresponding to the observation light. That is, an image signal corresponding to the observation image is generated. As the photoelectric conversion apparatus, the photoelectric conversion apparatus described in any one of the above embodiments can be used. The image signal is transmitted to a camera control unit (CCU) 1135 in the form of RAW data.

The CCU 1135 includes a central processing unit (CPU), a graphics processing unit (GPU), and the like. The CCU 1135 comprehensively controls the operations performed by the endoscope 1100 and a display device 1136. Furthermore, the CCU 1135 receives an image signal from the camera head 1102 and performs various image processing, such as development processing (demosaicing), for displaying an image based on the image signal.

Under the control of the CCU 1135, the display device 1136 displays an image based on the image signal subjected to image processing performed by the CCU 1135.

The light source device 1203 includes a light source, such as a light emitting diode (LED), and supplies the endoscope 1100 with irradiation light for capturing the image of a surgical site or the like.

An input device 1137 is an input interface to the endoscopic surgery system 1150. A user can input a variety of information and instructions to the endoscopic surgery system 1150 via the input device 1137.

A treatment tool control device 1138 controls driving of an energy treatment tool 1112 for tissue cauterization, incision, blood vessel sealing, or the like.

The light source device 1203 that supplies irradiation light to the endoscope 1100 when the image of a surgical site is captured can include, for example, a white light source, such as an LED, a laser light source, or combinations thereof. When the white light source is configured by a combination of R, G, and B laser light sources, the output intensity and output timing of each of the colors (each of the wavelengths) can be controlled with high accuracy. Thus, white balance of a captured image can be adjusted in the light source device 1203. In this case, the observation target is irradiated with laser light from each of the R, G, and B laser light sources in a time-division manner, and driving of an image pickup element of the camera head 1102 is controlled in synchronization with the irradiation timing. In this way, an image corresponding to each of the RGB colors can be captured in a time-division manner. According to the technique, a color image can be obtained without providing a color filter on the image pickup element.

In addition, the driving of the light source device 1203 may be controlled such that the intensity of the output light is changed at predetermined time intervals. A high dynamic range without so-called crushed shadows and blown out highlights can be generated by controlling the driving of the image pickup elements of the camera head 1102 in synchronization with the timing of the change in the intensity of the light, acquiring images in a time-division manner, and combining the images.

In addition, the light source device 1203 may be configured so as to be able to supply light in a predetermined wavelength band range corresponding to special light observation. In special light observation, the wavelength dependency of light absorption by a body tissue is used, for example. More specifically, a high contrast image of a predetermined tissue, such as a blood vessel on the surface of the mucous membrane, is captured by irradiating the tissue with light in a narrower band than the irradiation light used during normal observation (that is, white light).

Alternatively, in special light observation, fluorescence observation may be performed in which an image is captured using fluorescence generated by irradiation with excitation light. In fluorescence observation, a body tissue is irradiated with excitation light, and fluorescence from the body tissue can be observed. Alternatively, a reagent, such as indocyanine green (ICG), is locally injected into the body tissue, and the body tissue is irradiated with excitation light corresponding to the fluorescence wavelength of the reagent. Thus, a fluorescent image can be obtained. The light source device 1203 can be configured so as to supply narrowband light and/or excitation light corresponding to the special light observation.

Tenth Embodiment

Figure 23A:
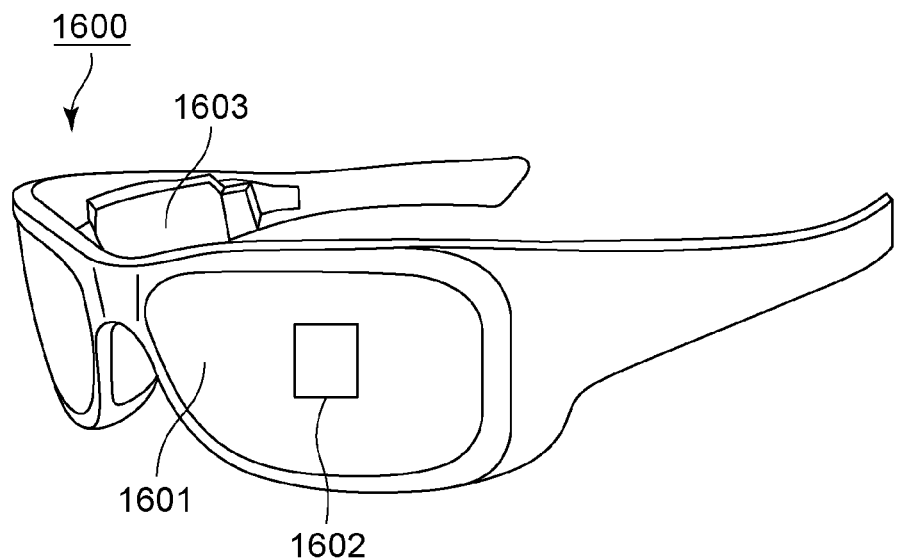
FIGS. 23A and 23B illustrate a photoelectric conversion system (i.e., smart glasses) according to a tenth embodiment.

A photoelectric conversion system according to the present embodiment is described below with reference to FIGS. 23A and 23B. FIG. 23A illustrates glasses 1600 (smart glasses), which are the photoelectric conversion system according to the present embodiment. The glasses 1600 include a photoelectric conversion apparatus 1602. The photoelectric conversion apparatus 1602 is the photoelectric conversion apparatus described in any one of the above embodiments. A display device including a light emitting device, such as an OLED or an LED, may be provided on the rear surface side of a lens 1601. One or more photoelectric conversion apparatuses 1602 may be provided. Furthermore, a plurality of types of photoelectric conversion apparatuses may be combined and used. The mounting location of the photoelectric conversion apparatus 1602 is not limited to that illustrated in FIG. 23A.

The glasses 1600 further include a control device 1603. The control device 1603 functions as a power source that supplies electric power to the photoelectric conversion apparatus 1602 and the display device. In addition, the control device 1603 controls the operations performed by the photoelectric conversion apparatus 1602 and the display device. The lens 1601 has an optical system formed therein to focus light onto the photoelectric conversion apparatus 1602.

Figure 23B:
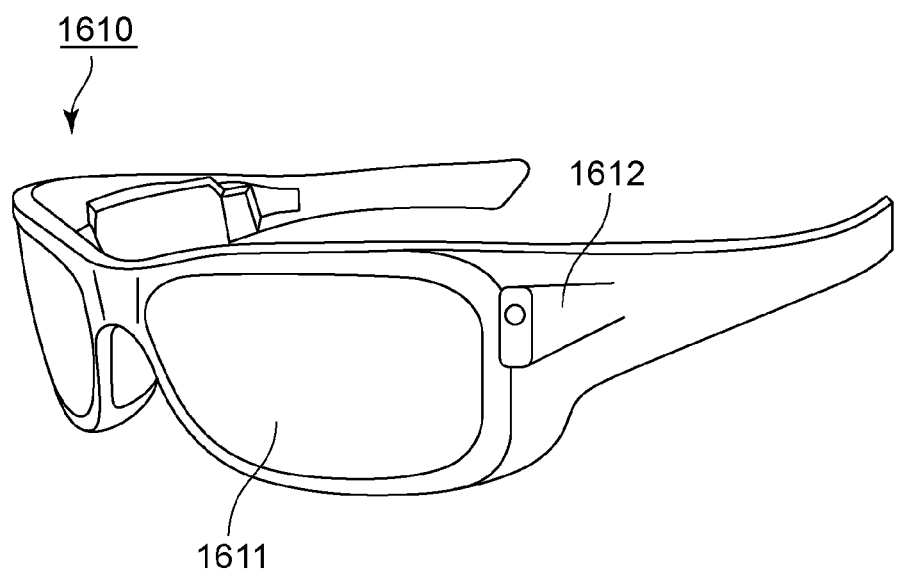

FIG. 23B illustrates glasses 1610 (smart glasses) according to an application example. The glasses 1610 include a control device 1612. The control device 1612 includes a photoelectric conversion apparatus corresponding to the photoelectric conversion apparatus 1602 and a display device. A lens 1611 includes, formed therein, the photoelectric conversion apparatus in the control device 1612 and an optical system for projecting light emitted from the display device. An image is projected to the lens 1611. The control device 1612 functions as a power source that supplies electric power to the photoelectric conversion apparatus and the display device and controls the operations performed by the photoelectric conversion apparatus and the display device. The control device may include a line-of-sight detection unit that detects the line of sight of a wearer. Infrared light may be used for line-of-sight detection. An infrared light emitting unit emits infrared light to the eyeballs of a user who is gazing at the display image. An image pickup unit including a light receiving element detects reflected light of the emitted infrared light from the eyeball and, thus, a captured image of the eyeball can be obtained. To reduce deterioration in image quality, a reduction unit is provided to reduce light from the infrared light emitting unit to a display unit in plan view.

The user's line of sight to the displayed image is detected from the captured infrared light images of the eyeball. Any known technique can be applied to line-of-sight detection using captured images of eyeballs. As an example, an eye gaze detection technique based on a Purkinje image obtained using reflection of irradiation light on the cornea.

More specifically, line-of-sight detection processing is performed on the basis of the pupillary-corneal reflection technique. The user's line of sight is detected by calculating a line of sight vector representing the orientation (the rotational angle) of the eyeball on the basis of the pupil image and the Purkinje image included in the captured eyeball image by using the pupillary-corneal reflection technique.

The display device according to the present embodiment may include a photoelectric conversion apparatus including a light receiving element and may control the display image of the display device on the basis of the user's line-of-sight information obtained from the photoelectric conversion apparatus.

More specifically, the display device determines a first field of view region that the user gazes at and a second field of view region other than the first field of view region on the basis of the line-of-sight information. The first field of view region and the second field of view region may be determined by a control unit of the display device. Alternatively, a first field of view region and a second field of view region determined by an external control device may be received. In the display area of the display device, the display resolution of the first field of view region may be controlled to be higher than the display resolution of the second field of view region. That is, the resolution of the second field of view region may be set to lower than that of the first field of view region.

Furthermore, the display area may have a first display area and a second display area different from the first display area, and a higher priority one of the first display area and the second display area may be determined on the basis of the line of sight information. The first field of view region and the second field of view region may be determined by the control unit of the display device or an external control device. Alternatively, a first field of view region and a second field of view region determined by an external control device may be received. The resolution of a high priority area may be set higher than the resolution of an area other than the high priority area. That is, the resolution of a relatively low priority area may be decreased.

Artificial intelligence (AI) may be used to determine the first field of view region and a high priority area. AI model may be a model configured to estimate the angle of the line of sight and the distance to an object in the line of sight from the eyeball image by using, as training data, eyeball images and the directions in which the eyeballs in the images are actually looking. The AI program may be stored in the display device, the photoelectric conversion apparatus, or an external device. When stored in the external device, the AI program is transmitted to the display device via communication.

In the case of display control based on visual recognition detection, the display control can be preferably applied to smart glasses that further include a photoelectric conversion apparatus that captures the image of the outside. The smart glasses can display captured external information in real time.

MODIFIED EMBODIMENTS

The disclosure is not limited to the above embodiments, and various modifications can be made.

For example, an example in which part of the configuration of any one of the embodiments is added to another embodiment and an example in which part of the configuration of any one of the embodiments is replaced by part of another embodiment are also included in embodiments of the disclosure.

In addition, the photoelectric conversion systems according to the sixth embodiment and the seventh embodiment are examples of photoelectric conversion systems to which the photoelectric conversion apparatus can be applied, and a photoelectric conversion system to which the photoelectric conversion apparatus according to the disclosure can be applied is not limited to the configurations illustrated in FIGS. 19, 20A, and 20B. The same applies to the ToF system according to the eighth embodiment, the endoscope according to the ninth embodiment, and the smart glasses according to the tenth embodiment.

It should be noted that the above-described embodiments merely illustrate specific examples for carrying out the disclosure, and the technical scope of the disclosure should not be construed to be limited by these. That is, the disclosure can be embodied in various forms without departing from its technical concept or main features.

According to the disclosure, pixels can be miniaturized while suppressing DCR.

While the disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-091511 filed Jun. 6, 2022, which is hereby incorporated by reference herein in its entirety.

What is claimed is:

1. An apparatus comprising:
a diode disposed in a layer having a first surface, a second surface opposite the first surface, and a third surface located between the first surface and the second surface,
wherein the diode includes
a first region of a first conductivity type disposed at a first depth,
a second region of a second conductivity type disposed at a second depth that is deeper than the first depth with respect to the second surface,
a third region disposed at a third depth that is deeper than the second depth with respect to the second surface,
a fourth region in contact with the third region,
a first contact electrode in contact with the second surface of the layer,
wherein the first contact electrode supplies a first voltage to the first region, and a second contact electrode in contact with the third surface of the layer,
wherein the second contact electrode supplies a second voltage different from the first voltage to the fourth region,
wherein a concentration of impurity of the second conductivity type in the second region is higher than a concentration of impurity of the second conductivity type in the third region, and
wherein the third surface is located between the second region and the second surface.

2. The apparatus according to claim 1, wherein the third surface is a surface of a trench structure provided on the second surface, and the third surface is opposite to the second surface.

3. An apparatus comprising:
a diode disposed in a layer having a first surface, a second surface opposite the first surface, and a third surface located between the first surface and the second surface,
wherein the diode includes
a first region of a first conductivity type disposed at a first depth,
a second region of a second conductivity type disposed at a second depth that is deeper than the first depth with respect to the second surface,
a third region disposed at a third depth that is deeper than the second depth with respect to the second surface,
a fourth region in contact with the third region,
a first contact electrode in contact with the second surface of the layer,
wherein the first contact electrode supplies a first voltage to the first region, and a second contact electrode in contact with the third surface of the layer,
wherein the second contact electrode supplies a second voltage different from the first voltage to the fourth region,
wherein the third surface is located between the second region and the second surface, and
wherein the second depth is defined as a depth at which a concentration of impurity of the second conductivity type in the second region is maximized.

4. The apparatus according to claim 3, wherein a portion of the second region and the second contact electrode are provided at the same depth.

5. The apparatus according to claim 1, wherein the second region has a first portion that overlaps the first region in plan view and a second portion, and
wherein the first portion is disposed at a depth closer to the second surface than the second portion.

6. An apparatus comprising:
a plurality of diodes disposed in a layer having a first surface, a second surface opposite the first surface, and a third surface located between the first surface and the second surface,
wherein the diodes each includes
a first region of a first conductivity type disposed at a first depth,
a second region of a second conductivity type disposed at a second depth that is deeper than the first depth with respect to the second surface,
a third region disposed at a third depth that is deeper than the second depth with respect to the second surface,
a fourth region in contact with the third region,
a first contact electrode in contact with the second surface of the layer, wherein the first contact electrode supplies a first voltage to the first region,
a second contact electrode in contact with the third surface of the layer,
wherein the second contact electrode supplies a second voltage different from the first voltage to the fourth region, and
a fifth region having a concentration of impurity of the first conductivity type that is lower than a concentration of impurity of the first conductivity type in the first region,
wherein the fifth region is in contact with part of a side wall of a trench structure having the third surface.

7. The apparatus according to claim 6, wherein the fifth region is in contact with the first region.

8. The apparatus according to claim 6, wherein a concentration of impurity of the second conductivity type in the second region is higher than a concentration of impurity of the second conductivity type in the third region.

9. The apparatus according to claim 6, wherein the second depth is defined as a depth at which a concentration of impurity of the second conductivity type in the second region is maximized.

10. The apparatus according to claim 9, wherein a portion of the second region and the second contact electrode are provided at the same depth.

11. The apparatus according to claim 6, wherein the second region has a first portion that overlaps the first region in plan view and a second portion, and
   wherein the first portion is disposed at a depth closer to the second surface than the second portion.

12. The apparatus according to claim 1, further comprising:
   a sixth region of the first conductivity type that overlaps the first region in plan view.

13. The apparatus according to claim 6, further comprising:
   a sixth region of the first conductivity type that overlaps the first region in plan view.

14. The apparatus according to claim 1, further comprising:
   a seventh region of the second conductivity type disposed at a fourth depth that is deeper than the third depth with respect the second surface,
   wherein the second contact electrode supplies the second voltage to the seventh region via the fourth region.

15. The apparatus according to claim 6, further comprising:
   a seventh region of the second conductivity type disposed at a fourth depth that is deeper than the third depth with respect the second surface,
   wherein the second contact electrode supplies the second voltage to the seventh region via the fourth region.

16. A system comprising:
   the apparatus according to claim 1; and
   a processing unit configured to generate an image using a signal output from the apparatus.

17. The system according to claim 16, wherein, in the apparatus, the third surface is a surface of a trench structure provided on the second surface, and the third surface is opposite to the second surface.

18. A mobile object comprising:
   the apparatus according to claim 1; and
   a control unit configured to control movement of the mobile object using a signal output from the apparatus.

19. The mobile object according to claim 18, wherein, in the apparatus, the third surface is a surface of a trench structure provided on the second surface, and the third surface is opposite to the second surface.

* * * * *